(12) United States Patent
Ogawa et al.

(10) Patent No.: US 6,673,526 B1
(45) Date of Patent: *Jan. 6, 2004

(54) PATTERN FORMATION METHOD AND METHOD AND APPARATUS FOR PRODUCTION OF A SEMICONDUCTOR DEVICE USING SAID METHOD

(75) Inventors: Tohru Ogawa, Kanagawa (JP); Masaya Uematsu, Kanagawa (JP)

(73) Assignee: Sony Corporation (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/518,363

(22) Filed: Aug. 23, 1995

(30) Foreign Application Priority Data

Aug. 26, 1994 (JP) .......................... PO6-202619
Aug. 14, 1995 (JP) .............................. 7-206887

(51) Int. Cl.$^7$ ................... G03B 27/54; G03B 27/42
(52) U.S. Cl. ................. 430/396; 430/5; 355/53; 355/77
(58) Field of Search .................. 355/53, 77; 430/396, 430/5

(56) References Cited

U.S. PATENT DOCUMENTS

| | | | |
|---|---|---|---|
| 5,300,971 A | 4/1994 | Kudo ........................... 355/53 |
| 5,305,054 A | 4/1994 | Suzuki et al. ................. 355/53 |
| 5,345,292 A | 9/1994 | Shiozawa et al. ............. 355/53 |
| 5,363,170 A | 11/1994 | Muraki ......................... 355/53 |
| 5,418,583 A | 5/1995 | Masumoto .................... 353/38 |
| 5,452,054 A | 9/1995 | Dewa et al. ................... 355/67 |
| 5,459,547 A | 10/1995 | Shiozawa ..................... 355/53 |
| 5,467,166 A | 11/1995 | Shiraishi ...................... 355/53 |
| 5,473,412 A | 12/1995 | Ozawa ......................... 355/77 |
| 5,483,311 A | 1/1996 | Sakakibara et al. ........... 355/53 |
| 5,530,518 A | 6/1996 | Ushida et al. ................ 355/53 |
| 5,546,225 A | 8/1996 | Shiraishi ...................... 355/53 |
| 5,607,821 A | * 3/1997 | Haruki et al. ................. 355/77 |
| 5,627,625 A | * 5/1997 | Ogawa ......................... 355/55 |
| 5,627,626 A | * 5/1997 | Inoue et al. ................... 430/5 |

OTHER PUBLICATIONS

Burgraaf, Pieter; "Lithography's Leading Edge . . . " in Semiconductor International (Feb. 1992). pp. 42–48.*

* cited by examiner

Primary Examiner—Martin Angebranndt
(74) Attorney, Agent, or Firm—Rader, Fishman & Grauer PLLC; Ronald P. Kananen, Esq.

(57) ABSTRACT

A pattern formation method and method and apparatus for production of a semiconductor device using that method which irradiate light from a light source to a phase shifting mask through a fly's-eye lens comprised of an assembly of a plurality of lenses, transfer the pattern of the phase shifting mask onto the substrate, and form the pattern on the substrate, wherein the amount of light made incident upon the center portion of the fly's-eye lens is lowered by 2 to 90 percent, preferably 10 to 90 percent, further preferably 20 to 80 percent or 20 to 60 percent, relative to the amount of light incident upon the peripheral portion of the fly's-eye lens.

7 Claims, 32 Drawing Sheets

$d_{PR1} \neq d_{PR2}$

| NECESSARY D.O.F ($\mu$m) | RESOLUTION ($\mu$m) | OPTIMUM NA |
|---|---|---|
| 1.50 | 0.35 | 0.42 |
| 1.20 | 0.30 | 0.48 |
| 1.00 | 0.28 | 0.54 |
| 0.80 | 0.25 | 0.61 |

Cr MASK METHOD
0.6λ/NA HOLE PATTERN

HALFTONE PHASE SHIFT METHOD
0.6λ/NA HOLE PATTERN

ON PRISM

ON FLY'S-EYE LENS

ON PRISM

ON FRY'S-EYE LENS

COMPARATIVE EXAMPLE 1

EXAMPLE C

COMPARATIVE EXAMPLE 1

EXAMPLE C

COMPARATIVE EXAMPLE 1

EXAMPLE C

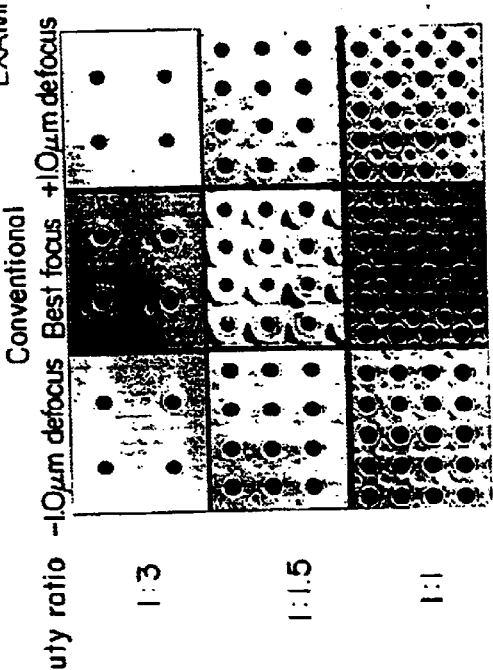
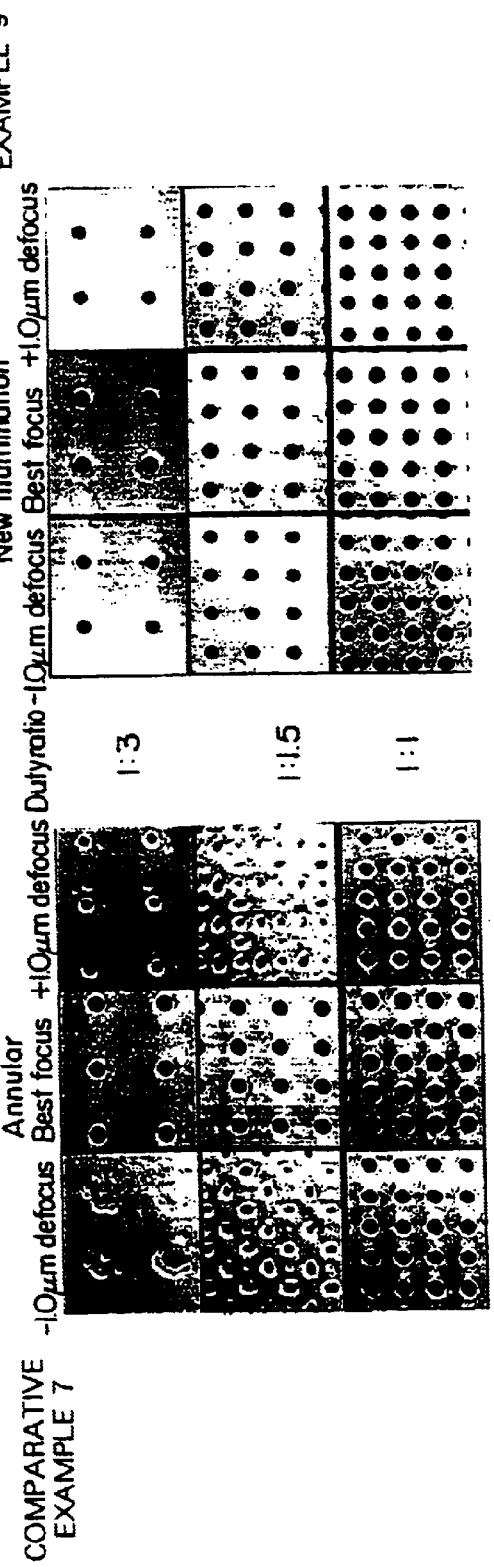
FIG. 28A EXAMPLE 9
FIG. 28B COMPARATIVE EXAMPLE 6
FIG. 28C COMPARATIVE EXAMPLE 7

FIG. 29
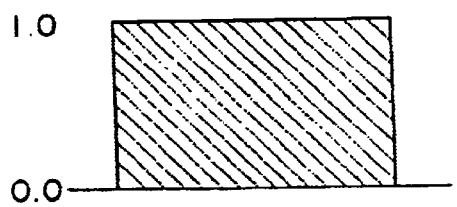
FIG. 30A   FIG. 30B
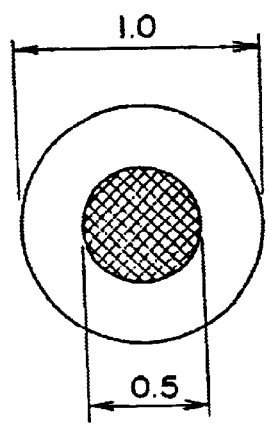
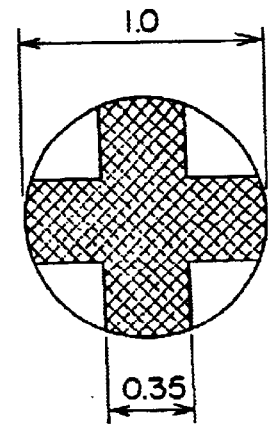
FIG. 31
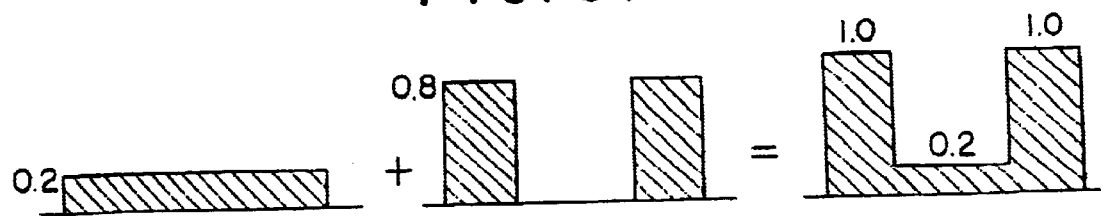

PATTERN FORMATION METHOD AND METHOD AND APPARATUS FOR PRODUCTION OF A SEMICONDUCTOR DEVICE USING SAID METHOD

BACKGROUND OF THE INVENTION

1. Field of the Invention

The present invention relates to a pattern formation method and a method and apparatus for production of a semiconductor device using that method, more particularly relates to a method of exposure which enables a pattern to be formed without the problem of a secondary peak even if using a phase shifting mask.

2. Description of the Related Art

At present, in the research and development of semiconductor integrated circuits, effort is being made to develop devices of a design rule of the sub-half micron order. In developing such devices, photolithography is indispensable. It is not too much to say that the resolution performance of the exposure devices used in photolithography, the so-called "reduction, projection, and exposure devices", determines the success or failure of research and development into semiconductor devices and the feasibility of mass production.

Conventionally, the resolution performance of reduced projection and exposure devices has been improved by enlarging the numerical aperture of the reduction projection lens or shortening the exposure wavelength based on the following Rayleigh criterion:

$$R = k1 \times \lambda / NA$$

where, R: resolution $\lambda$: Exposure wavelength

NA: Numerical aperture k1: Process coefficient

However, in the fabrication of a semiconductor device, there are step differences caused by the topography, wafer flatness, etc. of the semiconductor device, and therefore securing of the depth of focus is also an important parameter at the same time as the resolution performance. The dimensional precision of the resist pattern in the photolithography step at the time of fabrication of a semiconductor device is generally ±5 percent. In an actual device, as shown in FIG. 1, there is always unevenness in the surface of the semiconductor substrate S. For example, there is a convex portion In of polycrystalline silicon etc. As a result, the pattern of the resist PR is not formed on the same focal plane. For this reason, the dimensions of the pattern of the resist PR differ between the upper portion and the lower portion of a step difference. Of course, this becomes more conspicuous the finer the pattern in a case where a stepper of the same wavelength and same numerical aperture is used. This tendency is seen in common for all types of resist.

The depth of focus becomes smaller in primary proportion to the exposure wavelength and in inverse proportion to the square of the numerical aperture. At the mass production stage, a depth of focus of about 1.5 $\mu$m is necessary. For this reason, there are restrictions in order to satisfy both of the resolution performance and the depth of focus considered necessary.

FIGS. 2A and 2B show the dependency on the numerical aperture when the resolution performance of the depth of focus (D.O.F) in KrF excimer laser lithography, which is the most advanced exposure, is used as a parameter. As will be understood from the figures, the highest resolution which is obtained while satisfying the needed depth of focus of 1.5 $\mu$m is about 0.35 $\mu$m. Accordingly, it is extremely difficult to resolve a line width of 0.35 $\mu$m or less with a depth of focus of 1.5 $\mu$m or more. Some sort of technique for enlarging the depth of focus is necessary.

In response to such a request, in recent years, the halftone type phase shift method has been proposed. This exposure method is an extremely powerful method for improving the resolution and depth of focus of an isolated pattern such as a contact hole. In the halftone type phase shift method, as shown in FIG. 3, a semitransparent Cr, $Si_x N_y$, $SiO_x$, $N_y$, $Mo_x$, $Si_y$ film, or the like having a transmittance with respect to the exposure light of about several percent to about 20 percent, that is, allowing passage of a fine amount of exposure light therethrough, is used as the halftone film 2 corresponding to the dark portions 1. In the bright portions 3, both the film 2 and the transparent substrate (with a concave portion 5 formed therein) or only the film 2 is etched and made to act as a mask. At this time, by setting the phase difference between the bright portions 3 and the dark portions 1 formed by the semitransparent film to 180°, as shown in FIG. 4B, the gradient of the distribution of the intensity of the light in an isolated pattern (for example, a hole pattern of 0.6 $\lambda$/NA) can be made sharp. Note that, FIG. 4A shows the distribution of the intensity of the light in an isolated pattern using a conventional chromium mask.

In the design of this phase shifting mask, the transmittance of the halftone film 2 is an important factor. Namely, so as to make the gradient of the distribution of the intensity of the light in an isolated pattern sharper, it is sufficient to raise the transmittance of the halftone film 2. However, by raising the transmittance, the light shielding effect by the halftone film 2 is weakened, and the resist ends up exposed over its entire surface.

Also, usually, at the time of formation of a pattern, as shown in FIG. 5A, a secondary peak called a side lobe is generated due to the adjacency effect on both sides of the desired pattern position in the distribution of the intensity of the light irrespective of the light shielding position. The secondary peak becomes stronger by raising the halftone transmittance. As shown in FIG. 5B, even in a so-called completely isolated contact hole wherein, for example, when the design dimension of the hole pattern 6 is defined as W, the distance between the adjoining patterns is 3W or more, the peripheral portion becomes "gouged" in shape (numeral 8 part). With a shape as shown in FIG. 5B, there is concern that the diameter of the contact hole will be enlarged in the etching step.

Further, when it is intended to apply the halftone phase shifting mask method to a so-called periodic pattern portion having a high pattern density, the secondary peak becomes stronger due to interference between adjoining patterns, that is, the mutual adjacency effect, at the periodic pattern portion having the high pattern density.

Accordingly, when it is intended to form a device pattern by using the halftone phase shifting mask method, the design and a CAD process must be carried out with sufficient consideration given to the distance between patterns. This places a tremendous load on the design and CAD process and prevents practical application.

So as to solve the above-mentioned problems, intensive study is currently underway in various areas on how to enlarge the depth of focus without making the adjacency effect more conspicuous and without placing a heavy load on the design of the mask. However, no effective exposure method for enlarging the depth of focus without suffering from the above-described problems has yet been found. Accordingly, it is essential to quickly establish an exposure technique for enlarging the depth of focus without making the adjacency effect conspicuous and without placing a heavy load on the design of the mask.

At the present time, when a practical depth of focus cannot be obtained in the fabrication of a device, pattern formation has been carried out by using the multilayer resist method, electron beam exposure method, and the like. However, a sufficiently satisfactory effect has not been obtained.

Accordingly, it is essential to quickly establish an exposure technique for enlarging the depth of focus without making the adjacency effect conspicuous, without placing a heavy load on the design of the mask, and without exerting an advance influence on the aberration and other imaging characteristics by a method other than that mentioned above.

SUMMARY OF THE INVENTION

The present invention was made in consideration of the above-described situation and has as an object thereof to provide a pattern formation method and a method and apparatus for production of a semiconductor device using the same which, when fabricating a semiconductor device or the like, decides on the method of enlarging the depth of focus so that a stable resist pattern can be formed well even if the mask pattern thereof is fine and thereby enables a good resist patterning.

The present invention provides a method for enlarging the depth of focus at the time of fabrication of a semiconductor device without exerting an adverse influence upon the aberration and imaging characteristic by using an ordinary mask having any pattern density, in particular, a halftone phase shifting mask, even if the mask pattern of the semiconductor device is fine. The above-described object is achieved by this. This will be understood by analyzing the optical system of the exposure device. Namely, the present invention was obtained by the following discovery by the present inventor.

The depth of focus was enlarged without exerting an adverse influence upon the aberration and other imaging characteristics by using a halftone phase shifting mask having any pattern density by using the following means:

(1) So as to enable the use of the halftone phase shifting mask method for a design pattern having any pattern density without placing a tremendous load on the design and CAD process, it is sufficient if use may be made of the so-called periodic pattern portion having a high pattern density. Such a periodic pattern portion having a high pattern density is formed by interference of adjoining patterns, so it is sufficient if the secondary peak in the distribution of the intensity of the light due to the mutual adjacency effect can be reduced.

(2) The distribution of the intensity of the light depends upon the distribution of the intensity of the light in the effective light source of the exposure device. Namely, the optical projection system of the exposure device, that is, the "stepper", as shown in FIG. 6, has a whole system diaphragm 10 arranged at first group and second group of focal planes. It is a dual telecentric imaging system and is an afocal system as a whole. Namely, the mask surface 12 and pupil surface (substantially equal to the diaphragm 10) and the pupil surface and wafer surface 14 are in a Fourier transformation relationship. Also, the light from the illumination optical system for illuminating the mask is shown developed completely as plane waves. Due to the afocal characteristic, individual plane waves correspond to individual light emission points of the secondary light source (also called the effective light source) 16, that is, the fly's-eye lens.

(3) Based to the characteristic shown by (2), if the respective coordinate systems of the mask surface, pupil surface, and the wafer surface are defined as (x, y), ($\xi$, $\eta$), and ($\alpha$, $\beta$) and the focal distances of the first group and second group are defined as f1 and f2 and, also, the transmission function of the mask is defined as o (x, y), the amplitude distribution f ($\xi$, $\eta$, $\theta_1$, $\theta_2$) on the pupil surface can be represented by the following equation:

$$f(\xi,\eta,\theta_1,\theta_2)=\int\int o(x,y)\exp\{jk(\sin\theta_1 x+\sin\theta_2 y)\}$$

$$\exp\{jk(\xi x+\eta y)/f1\}dxdy=\int\int o(x,y)\exp[jk\{(\sin\theta_1+\xi/f1)x+(\sin\theta_2+\eta/f1)y\}]dxdy \quad (1)$$

where, $\theta_1$, and $\theta_2$ are made the incident angles of the plane wave incident upon the mask in the x and y directions.

When defining the amplitude distribution on the wafer surface as g ($\alpha$, $\beta$, $\theta_1$, $\theta_2$) and defining the pupil function as p ($\xi$, $\eta$), the following equation stands:

$$g(\alpha,\beta,\theta_1,\theta_2)=\int\int f(\xi,\eta,\theta_1,\theta_2)\exp\{-jk(\alpha\xi+\beta\eta)\}d\xi d\eta=\int\int\int o(x,y)p(\xi,\eta)$$

$$\exp[jk\{(\sin\theta_1+\xi/f1)x+(\sin\theta_2+\eta/f2)y\}]$$

$$\exp\{-jk(\alpha\xi+\beta\eta)\}dxdyd\xi d\eta \quad (2)$$

The distribution of intensity I ($\alpha$, $\beta$, $\theta_1$, $\theta_2$) of the plane wave incident on the wafer surface by $\theta_1$ and $\theta_2$ can be represented by the following equation:

$$I(\alpha,\beta,\theta_1,\theta_2)=g(\alpha,\beta,\theta_1,\theta_2)g^*(\alpha,\beta,\theta_{1,\theta 2}) \quad (3)$$

Therefore, the overall distribution of intensity I ($\alpha$, $\beta$) becomes the superposition of the plane waves, and therefore if the weighing function is defined as W ($\theta_1$, $\theta_2$), the following equation stands:

$$I(\alpha,\beta)=\int\int w(\theta_1,\theta_2)I(\alpha,\beta,\theta_1,\theta_2)d\theta_1 d\theta_2 \quad (4)$$

Were, when assuming "the mask is a lattice pattern of equal intervals parallel to the y-axis", the transmission function o (x, y) of the mask can be represented by the following equation defining the mask frequency as $\omega$:

$$o(x,y)=o(x)=\sum_{n=-\infty}^{\infty}a_n\exp(jn\omega x) \quad (5)$$

$$-\infty<n<+\infty$$

Accordingly, the amplitude distribution f ($\xi$, $\eta$, $\theta_1$, $\theta_2$) on the pupil surface can be represented by the following equation:

$$f(\xi,\eta,\theta_1,\theta_2)=\int\int\sum a_n\exp(jn\omega x) \quad (6)$$

$$\exp[jk\{\sin\theta_1+\xi/f1)x+(\sin\theta_2+\eta/f1)y\}]dxdy=$$

$$\sum_n a_n\delta(\sin\theta_1+n\omega/k+\xi/f1)\delta(\sin\theta_2+\eta/f1)$$

When the wave plane aberration on the pupil surface is W ($\xi$, $\eta$), the amplitude distribution g ($\alpha$, $\beta$, $\theta_1$, $\theta_2$) on the wafer surface can be represented by the following equation:

$$g(\alpha, \beta, \theta_1, \theta_2) = \sum_n a_n \int\int \delta(\sin\theta_1 + n\omega/k + \xi + fl)\delta(\sin\theta_2 + \eta/fl) \quad (7)$$

$$p_n(\theta_1, \theta_2)\exp\{jW(\xi,\eta)\}\exp\{-jk(\xi\alpha + \eta\beta)\}d\xi d\eta =$$

$$\sum_n a_n p_n(\theta_1, \theta_2)\exp[jW\{-fl(\sin\theta_1 + n\omega/k), -fl\sin\theta_2\})$$

$$\exp[jk(\sin\theta_1 + n\omega/k)(fl/f2)\alpha]\exp[jk(fl/f2)\beta\sin\theta_2]$$

Here, as apparent from the aforesaid equation (7), the spectrum distribution of the object on the pupil surface is the sum of δ-functions. Accordingly, a decision whether or not the n-th deffracted light enters into the pupil is clear. Therefore, use is made of a vignetting factor Pn for deciding whether the deffracted light should or should not enter into the pupil in equation (8).

$$P_n(\theta_1, \theta_2) = 1 \text{ spectrum exit in pupil plane 0 otherwise} \quad (8)$$

From the above, the distribution of intensity I ($\alpha\beta, \theta_1, \theta_2$) of the individual plane waves on the wafer surface can be represented by the following equation:

$$I(\alpha, \beta, \theta_1, \theta_2) = \sum_n\sum_m a_n a_m p_n(\theta_1, \theta_2) \quad (9)$$

$$p_m(\theta_1, \theta_2)\exp[jW\{-fl(\sin\theta_1 + n\omega/k), -fl\sin\theta_2\} -$$

$$jW\{-fl(\sin\theta_1 + n\omega/k, -fl\sin\theta_2\}]\exp[j(n-m)(fl/f2)\omega\alpha]$$

In the case of ideal imaging ignoring aberration etc., the following equation stands:

$$W(\xi,\eta) = o \quad (10)$$

Therefore, the distribution of intensity I ($\alpha, \beta, \theta_1, \theta_2$) of the individual plane waves can be represented by the following equation:

$$I(\theta_1, \theta_2) = \sum_n a_n^2 p_n(\theta_1, \theta_2) + \quad (11)$$

$$2\sum\sum a_n a_m p_n(\theta_1, \theta_2) p_m(\theta_1, \theta_2)\cos\{(fl/f2)(n-m)\omega\alpha\}$$

That is, the above-described equation is weighted in accordance with the ratio of intensities of the respective points of the fly's-eye lens and superposed to find the overall distribution of the intensity of the light I ($\alpha, \beta$) on the wafer surface.

(4) The above-described equation (11) is a basic equation when performing ideal imaging. Below, the above-described equation (11) is actually analyzed. So as to obtain a strict solution, it is necessary to superpose all orders of the deffracted light, but even if attention is paid to only the 0-th order and ±1-th order light in actuality, the higher order deffracted light is rejected by the pupil at the problematic fine line widths and therefore generality of the results of analysis is not lost.

(5) When considering only the 0-th order and ±1-th order light, due to the positional relationship of the rejection of the deffracted light shown in FIG. 7, only the four following cases exist in equation (12):

(I)
$$P_0 = P_1 = P_{-1} = 1$$

$$I(\theta_1,\theta_2) = [a_0 + 2a_1 \cos\{(f1/f2)\omega\alpha\}]^2 \quad (12)$$

(II)
$$P_0 = P_1 = 1, P_{-1} = 0 \text{ or } P_0 = P_{-1} = 0, P_1 = 0$$

$$I(\theta_1,\theta_2) = a_0^2 + a_1^2 + 2a_0 a_1 \cos\{(f1/f2)\omega\alpha\} \quad (13)$$

(III)
$$P_0 = 1, P_1 = P_{-1} = 0$$

$$I(\theta_1,\theta_2) = a_0^2 \quad (14)$$

(IV)
$$P_0 = P_1 = 0, P_{-1} = 1 \text{ or } P_0 = P_{-1} = 0, P_1 = 1$$

$$I(\theta_1,\theta_2) = a_1^2 \quad (15)$$

The case of (1) described above (equation (12)) is a case where all of the 0-th order and ±1-th order lights are fetched and imaging is carried out by three-beam interference. The case of (II) described above (equation (13)) is a case where one of the 0-th order and ±1-th order lights is fetched and the imaging is carried out by two-beam interference. The case of (III) described above (the above-described equation (14)) is a case where only the 0-th order light is fetched and occurs under the resolution limit, that is, when the space frequency is high. The case of (IV) described above (the above-described equation (15)) is a case where one of the ±1-th order lights is fetched and occurs when the light source is extremely large.

(6) By substituting each of the above-described equations (12) to (15) into the above-described equation (4), the overall distribution of intensity I ($\alpha, \beta$) is found. However, the analysis of the above-described equations (12) to (15) suggests how it is possible to use the halftone phase shifting mask method with respect to a design pattern having any pattern density. Namely, when differentiating equation (12), there is a solution with which the cosine term and sine term become 0. This means that where imaging is carried out by three-beam interference, the secondary peak is always generated. Also, even if the above-described equation (13) is differentiated, only a solution with which the sine term becomes 0 exists. This suggests that the secondary peak will not be generated when the imaging is carried out by two-beam interference. Namely, it suggests that, when a light source giving a strong intensity of the light at the center portion of the fly's-eye lens is used as in the usual stepper, the three-beam interference becomes dominant and a secondary peak is generated, while when a light source giving a strong intensity of the light at the peripheral portion of the fly's-eye lens is used as in so-called oblique incident illumination, it becomes two-beam interference and a secondary peak is not generated.

(7) With the oblique incident illumination technique, the illumination light is illuminated on the mask surface in an oblique direction, and as a result, either of the 0-th order light or +1-th order light is made incident upon the pupil surface as shown in FIG. 8 and FIG. 9B, the other primary light is rejected by the lens barrel, etc., and the pattern is formed by the two-beam interference. As a result, the apparent numerical aperture of the lens can be reduced and there is a great effect of improvement of the depth of focus. On the other hand, however, there are problems such as an increase of the adjacency effect due to the reduction of the effective light source, a lowering of the illuminance, an increase of the unevenness of illuminance, a lowering of the exposure margin, a strong influence of the telecentricity, etc.

Note that, in FIG. 8, reference numeral 20 denotes a lamp or a laser; reference numeral 21 denotes a collimetor;

reference numeral 22 denotes a fly's-eye lens; reference numeral 23 denotes a condenser lens; and reference numeral 24 denotes a reticle (mask). Also, FIG. 9A shows the case of three-beam interference; and FIG. 9B shows the case of two-beam interference.

(8) When considering the situation of the above-described (6) and (7), it is understood that it is desirable to have a distribution of the intensity of the light on the fly's-eye lens that emphasizes the oblique incident component to such an extent that a secondary peak, which is a problem in the halftone phase shifting mask, is not generated and has a vertical incident component such that the problem possessed by the oblique incident exposure method is not generated.

(9) Based on the above-described concept, the inventor discovered that the format shown in FIGS. 10A and 10B is suitable as the distribution of the amount of light on the fly's-eye surface considering, in patterns of all directions, the depth of focus of the periodic pattern, the depth of focus of the isolated pattern, the generation of the secondary peak, the degree of the adjacency effect, the illuminance, the unevenness of illuminance, the distortion change, etc., and thereby completed the present invention. FIG. 10A shows the distribution of the amount of light of the light incident upon the fly's-eye lens by numerals. The asterisk parts indicate the peak parts of the amount of light and the numerals 0 to 9 show the proportions of the amount of light where the peak part is defined as 10. A distribution of the amount of light is exhibited which is low in the center portion and high in the peripheral portions. Also, FIG. 10B shows three-dimensionally the distribution of the amount of light shown in FIG. 10A.

(10) The present invention can be preferably used in a case where the mask pattern of the semiconductor device is transferred to a resist by using photolithography and in other cases.

Concretely, the method of pattern formation according to the present invention comprises irradiating light from an effective light source to a mask, transferring the pattern of the mask onto a substrate, and forming the pattern on the substrate, wherein the amount of light emitted from a center portion of the aforesaid effective light source is lowered by a certain amount with respect to the amount of light emitted from the peripheral portions of the effective light source.

The amount of the light emitted from the center portion of the effective light source is preferably lowered by 2 to 90 percent with respect to the peak value of the amount of light emitted from the peripheral portions of the effective light source.

As the mask, use may be made of an ordinary chromium mask or phase shifting mask etc. The present invention is particularly effective in the case of use of a phase shifting mask. The phase shifting mask is not particularly limited and may for example be a rim type or outrigger type phase shifting mask.

The effective light source is not particularly limited, but for example suitable use may be made of a fly's eye lens comprising an assembly of a plurality of lenses. Alternatively, use may be made of a plurality of optical fibers as the effective light source.

The region of the center portion of the aforesaid effective light source where the amount of light is lowered is for example a region of 10 to 40 percent of the outer diameter of the effective light source.

The peak of the amount of light at the peripheral portions of the aforesaid effective light source appears for example at a few points at rotary symmetrical positions at the peripheral portions of the effective light source.

The amount of light incident upon the center portion of the aforesaid effective light source can be lowered in relation to the peak value of the amount of light incident upon the peripheral portions of the effective light source by using a beam splitter and a pyramid or conical prism lens. Further, the amount of the light incident upon the center portion of the effective light source can also be lowered with respect to the peak value of the amount of light incident at the peripheral portions of the effective light source by using a beam splitter alone, or pyramid or conical prism alone, or a plurality of pyramid or conical prisms.

It is also possible to lower the amount of light incident upon the center portion of the aforesaid effective light source lens relative to the peak value of the amount of light incident upon the peripheral portions of the effective light source by using a filter having a high transmittance at the peripheral portions as against the center portion.

It is also possible to lower the amount of light emitted from the center portion of the aforesaid fly's eye lens relative to the peak value of the amount of light emitted from the peripheral portions of the fly's eye lens by using a mechanical filter having opening portions corresponding to the individual lenses of the fly's-eye lens and having diameters of the related opening portions larger at the peripheral portions relative to the center portion.

It is also possible to lower the amount of light incident upon the center portion of the aforesaid effective light source relative to the peak value of the amount of light incident upon the peripheral portions of the effective light source by using a prism and optical parts arranged so that they can be made to approach or move away from this prism in the light path axis direction.

It is also possible to lower the amount of light emitted from the center portion of the aforesaid effective light source relative to the peak value of the amount of light emitted from the peripheral portions of the effective light source by dividing the beam incident upon the aforesaid effective light source to two or more beams, irradiating the two or more divided beams onto the aforesaid effective light source by using a movable mirror, and utilizing the difference in scanning speed at respective points of the surface of the effective light source dependent upon the surface shape of the aforesaid movable mirror.

The diameters of the individual lens of the fly's eye lens may be uniform or may be larger at the center portion than the peripheral portions. For example, in a fly's eye lens, the diameters of the individual lens at the center portion may be made 1.1 to 3 times the diameters of the individual lenses at the peripheral portions. By configuring the lens in this way, it is possible to prevent unevenness of illumination.

Further, in the present invention, when a single exposure time is T, it is possible to pass the light through a first filter with a higher transmittance at the peripheral portions than the center portion for a time of 0.05×T to 0.95×T and to pass it through a second filter or not pass it through a filter in the remaining exposure time. By this, it is possible to lower the amount of light from the center portion of the effective light source relative to the peak value of the amount of light emitted from the peripheral portions of the effective light source in just a single exposure time.

The apparatus for pattern formation according to the present invention is one irradiating light from an effective light source to a mask, transferring the pattern of the mask onto a substrate, and forming the pattern on the substrate and is provided with a light intensity distribution correcting means for lowering the amount of light emitted from a center portion of the aforesaid effective light source by a certain amount with respect to the amount of light emitted from the peripheral portions of the effective light source.

The light intensity distribution correcting means preferably is a means for lowering the amount of the light emitted from the center portion of the effective light source by 2 to 90 percent with respect to the peak value of the amount of light emitted from the peripheral portions of the effective light source.

The mask is preferably a phase shifting mask.

The effective light source is preferably a fly's eye lens comprising an assembly of a plurality of lenses. The diameters of the individual lenses of the fly's eye lens are preferably larger at the center portion than the peripheral portions.

The region of the center portion of the aforesaid effective light source where the amount of light is lowered by the light intensity distribution correcting means is preferably a region of 10 to 40 percent of the outer diameter of the effective light source.

The peak of the amount of light at the peripheral portions of the aforesaid effective light source preferably appears at a few points at rotary symmetrical positions at the peripheral portions of the effective light source.

The light intensity distribution correcting means preferably has an optical element which lowers the amount of light incident upon the center portion of the effective light source in relation to the peak value of the amount of light incident upon the peripheral portions of the effective light source. In a fly's eye lens, the diameters of the individual lens at the center portion are preferably 1.1 to 3 times the diameters of the individual lenses at the peripheral portions.

The optical element is preferably a beam splitter and/or a prism lens.

The light intensity distribution correcting means preferably has a filter having a high transmittance at the peripheral portions as against the center portion.

The light intensity distribution correcting means preferably has a mechanical filter, which mechanical filter has opening portions corresponding to the individual lenses of the fly's-eye lens and has diameters of the related opening portions larger at the peripheral portions relative to the center portion.

The light intensity distribution correcting means preferably has an optical element and optical parts arranged so that they can be made to approach or move away from this optical element in the light path axis direction. In this case, a prism, for example, may be used as the optical element.

The light intensity distribution correcting means preferably further has means for dividing the beam incident upon the aforesaid effective light source to two or more beams, a movable mirror for irradiating the two or more divided beams onto the aforesaid effective light source, and scan means for lowering the amount of light emitted from the center portion of the aforesaid effective light source relative to the peak value of the amount of light emitted from the peripheral portions of the effective light source by using the difference in scanning speed at respective points of the surface of the effective light source dependent upon the surface shape of the aforesaid movable mirror.

The light intensity distribution correcting means may also have a first filter with a higher transmittance at the peripheral portions than the center portion and a switching means for switching between a state passing light through the first filter for a single exposure time and a state performing exposure without passing through the first filter. In this case, the apparatus of the present invention preferably further has a second filter with a distribution of transmittance different from the first filter and causes the light to pass through the second filter in the state performing exposure without passing through the first filter.

The switching means preferably has a rotary disk on which at least the first filter is mounted and a drive means for driving the rotation of the rotary disk. Further, the switching means may have a slide mechanism enabling at least the first filter to move slidably. Further, as the switching means, use may be made of an optical shutter type optical material whose transmittance of light changes according to the voltage applied.

The method of production of a semiconductor device according to the present invention is particularly suitable for use when making a semiconductor device on a semiconductor substrate using the above mentioned method of pattern formation.

BRIEF DESCRIPTION OF THE DRAWINGS

These and other objects and features of the present invention will become clearer from the following description of the preferred embodiments made with reference to the attached drawings, in which

FIGS. 15A and 15B are views showing a method of superposition of beams, in which FIG. 15A shows the state before the superposition and FIG. 15B shows the state after the superposition;

FIGS. 22A and 22B show the effective of improvement of the depth of focus with a line width of 0.30 µm, in which FIG. 22A is a graph showing a depth of focus when the distribution of the intensity of the light on the conventional (Comparative Example 1) fly's-eye lens is used without use of the halftone phase shifting mask and FIG. 22B is a graph showing the depth of focus when the exposure method according to Example C is used;

FIGS. 28A to 28C are SEM photographs of hole patterns of the examples and comparative examples;

FIG. 29 is a view of the distribution of the intensity of the light used in Example 10;

FIGS. 30A and 30B are views of examples of filters used in the examples;

FIG. 31 is a view showing the concept of addition of distributions of the intensity of the light;

DESCRIPTION OF THE PREFERRED EMBODIMENTS

Below, embodiments of the present invention will be concretely explained. Note, of course, the present invention is not restricted by the embodiments.

EXAMPLE 1

Figure 1:
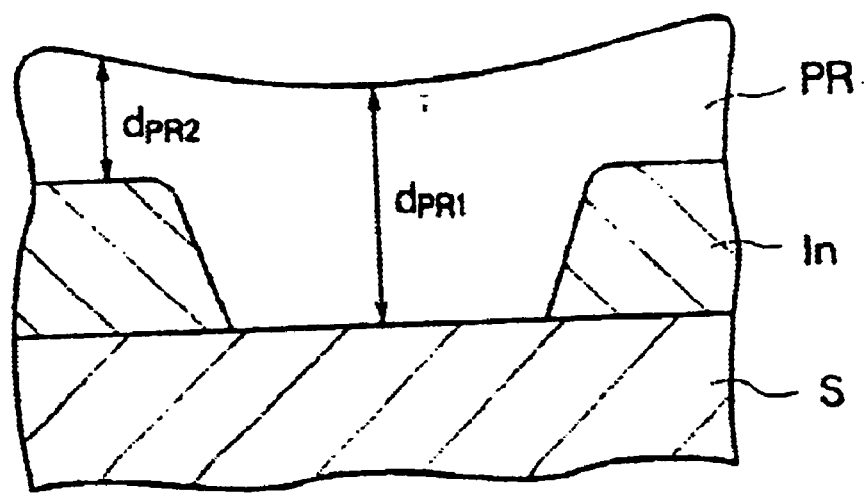
FIG. 1 is a view showing the fact that unevenness is always present on a substrate surface in an actual device.
Figures 2A, 2B:
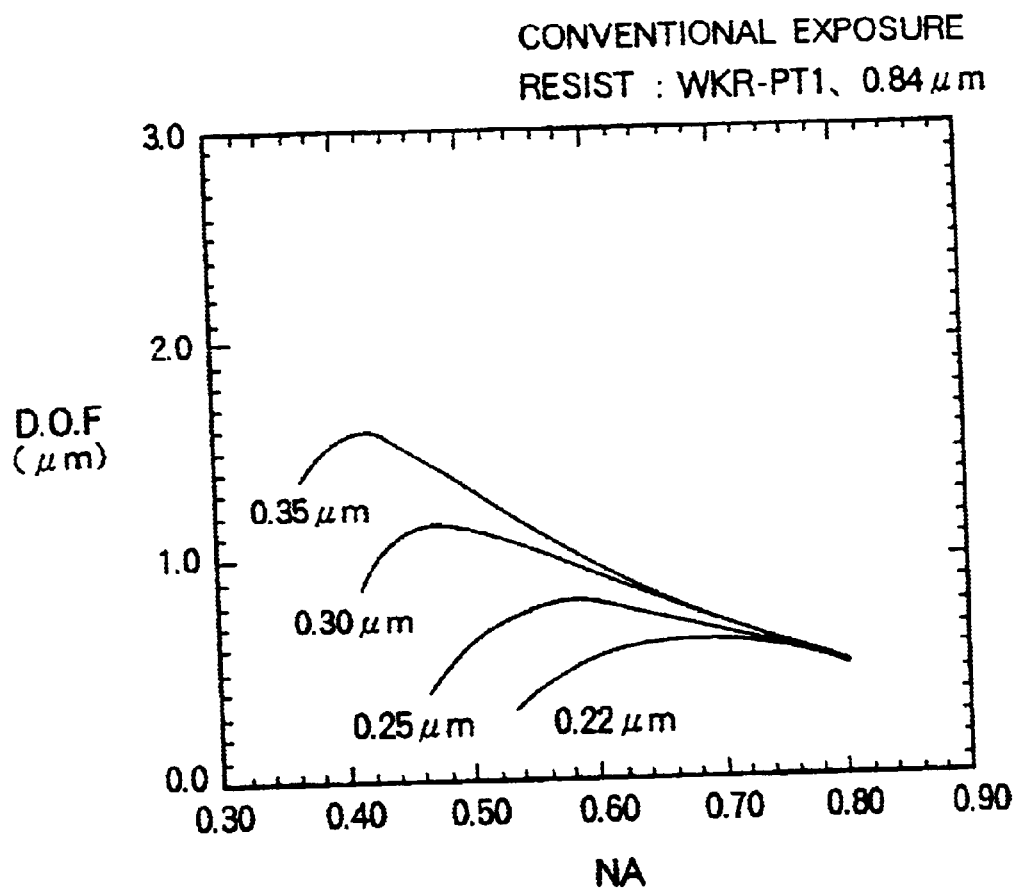
FIG. 2A is a graph showing the dependency on the numerical aperture when the resolution of a depth of focus in a KrF excimer laser lithography is used as a parameter and FIG. 2B is a table thereof.
Figure 3:
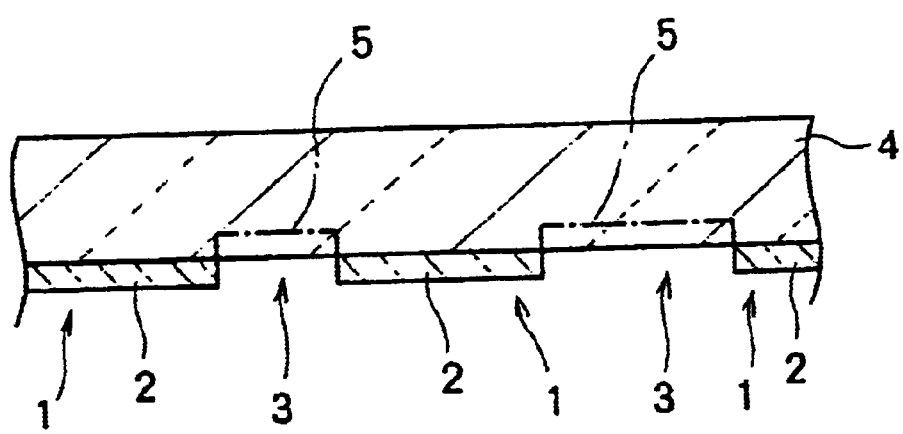
FIG. 3 is a a cross-sectional view of a phase shifting mask used in a halftone type phase shift method.
Figure 4A:
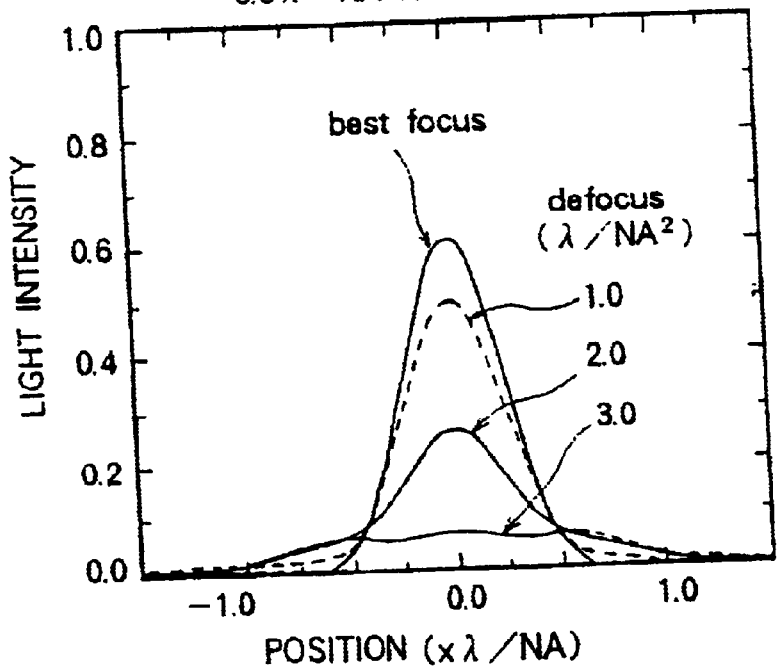
FIG. 4A is a graph showing the distribution of the intensity of the light on a wafer surface according to a chromium mask method and FIG. 4B is a graph showing the distribution of the intensity of the light on the wafer surface according to the halftone phase shift method.
Figure 4B:
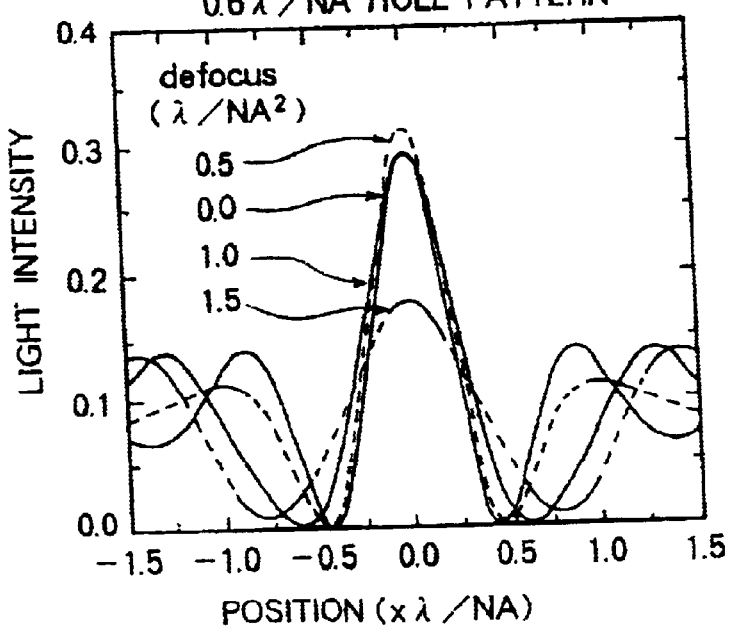
Figure 5A:
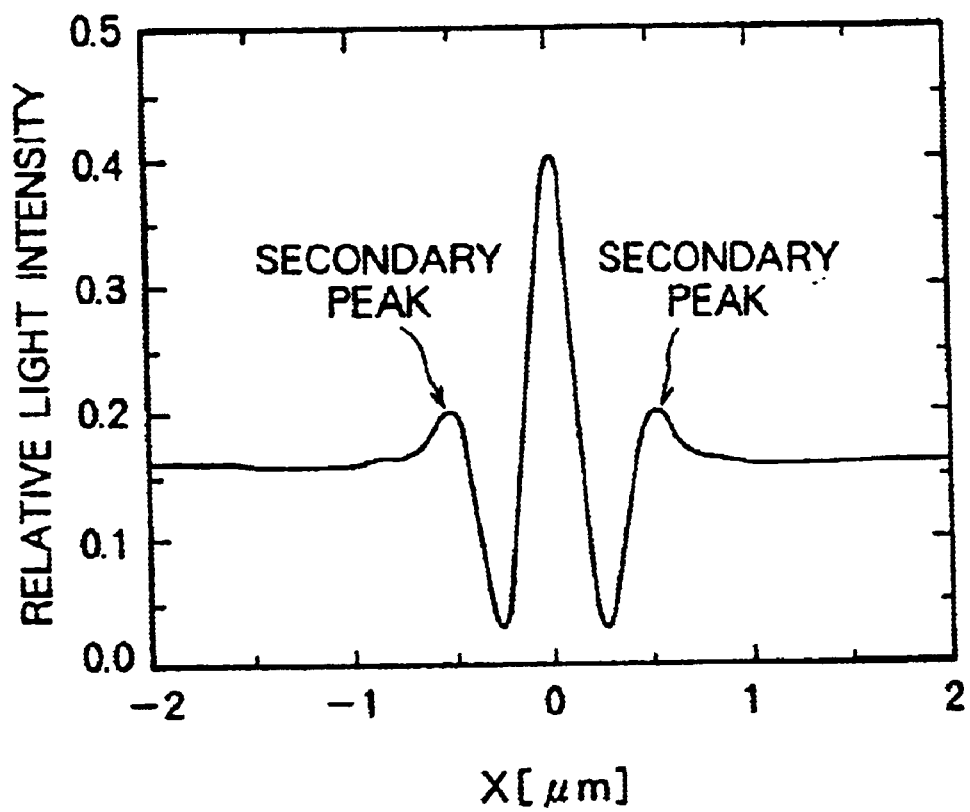
FIG. 5A is a graph showing the existence of a secondary peak according to the halftone type phase shift method and FIG. 5B is a cross-sectional view showing that the peripheral portions are "gouged" in shape due to the secondary peak even in an isolated contact hole.
Figure 5B:
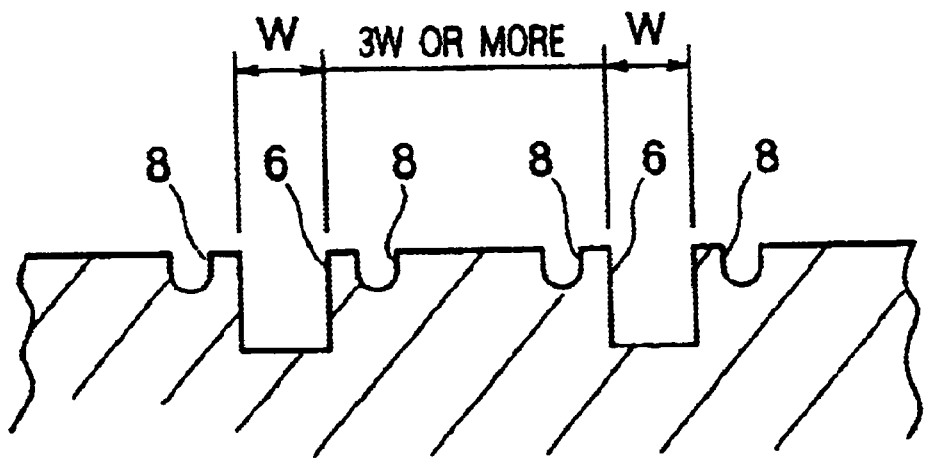
Figure 6:
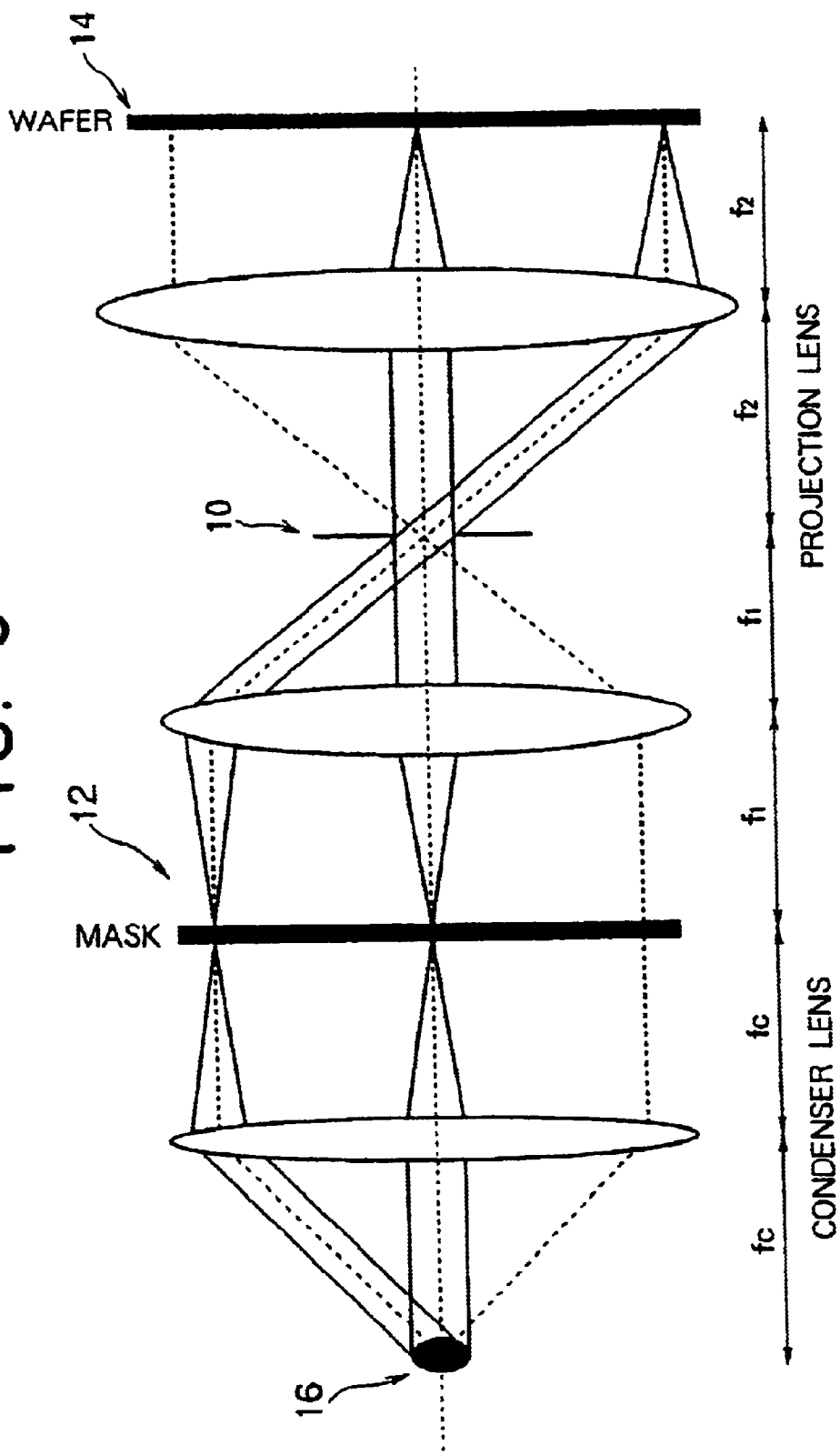
FIG. 6 is a conceptual view of a projection optical system of a stepper.
Figure 7:
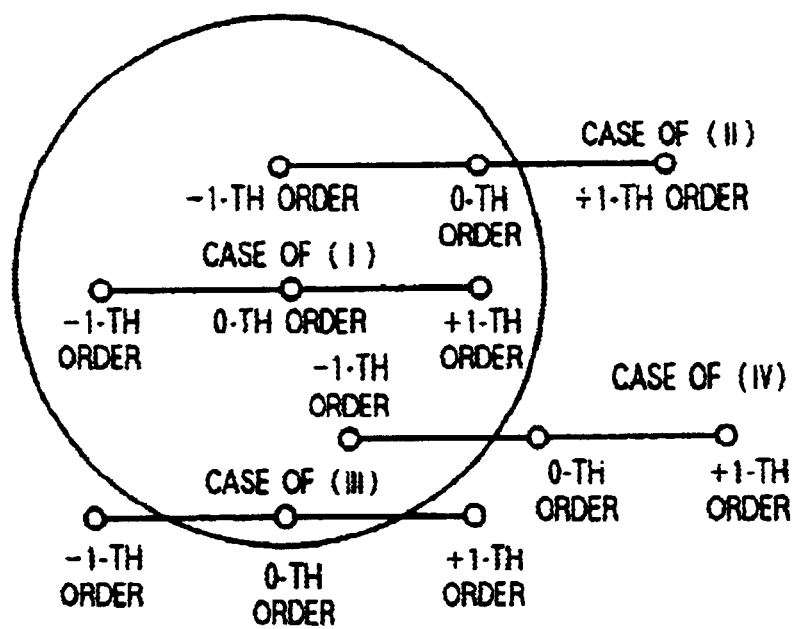
FIG. 7 is a view showing the positional relationship of rejection of deffracted light.
Figure 8:
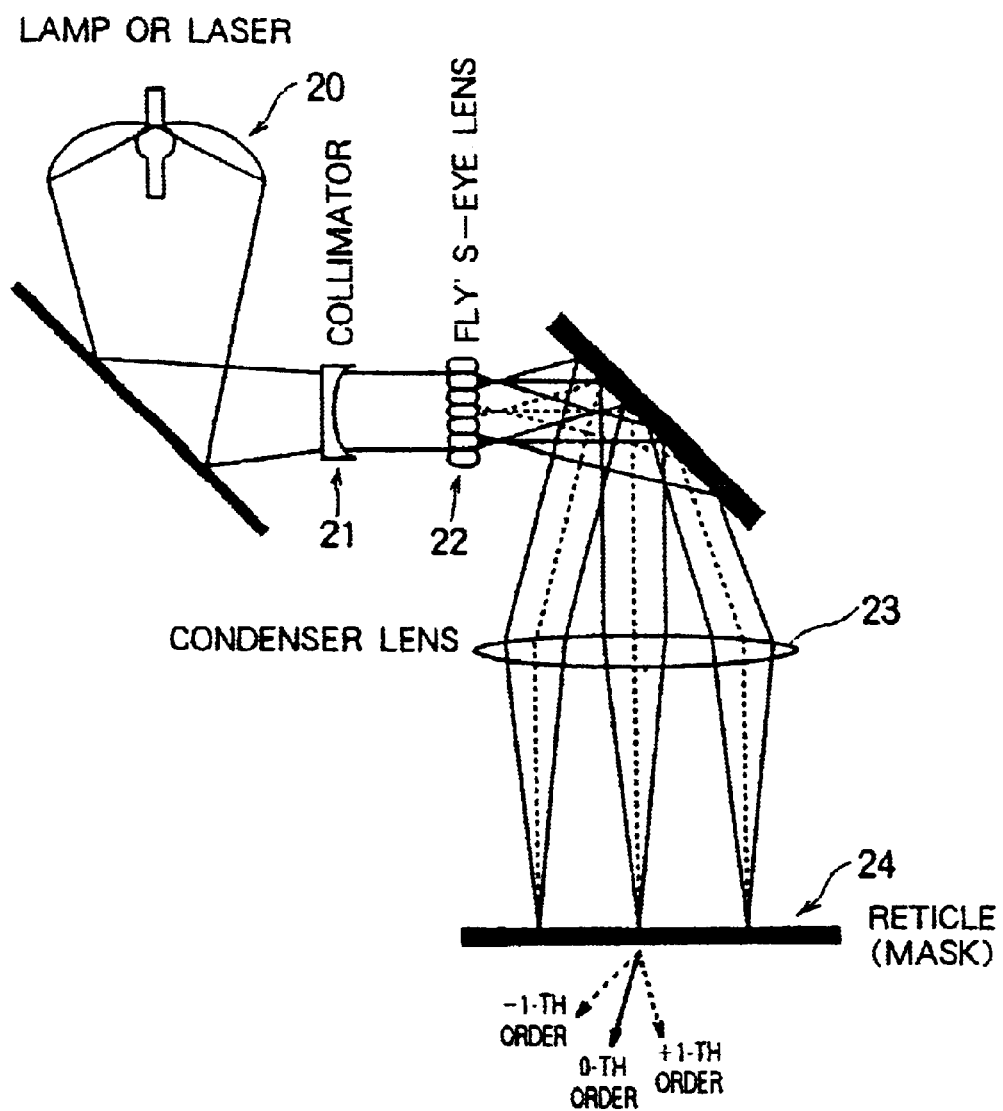
FIG. 8 is a view showing the concept of an oblique incident illumination technique.
Figures 9A, 9B:
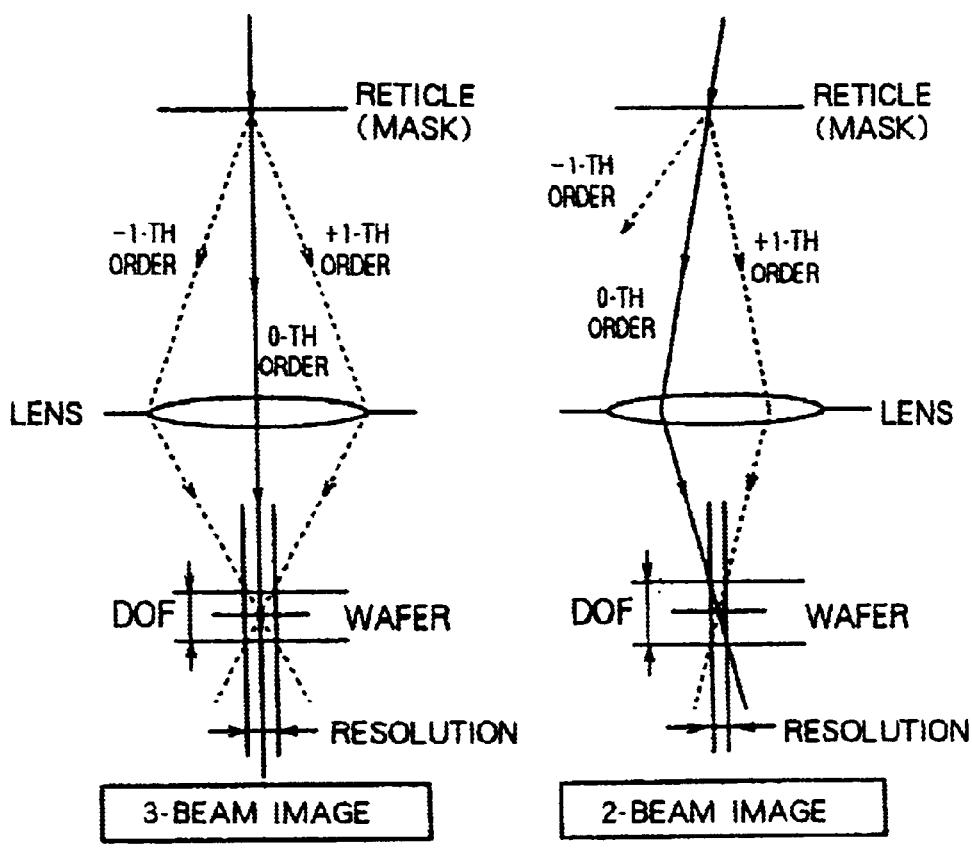
FIG. 9A shows a case of three-beam interference and FIG. 9B is a conceptual view showing the case of two-beam interference.
Figures 10A, 10B:
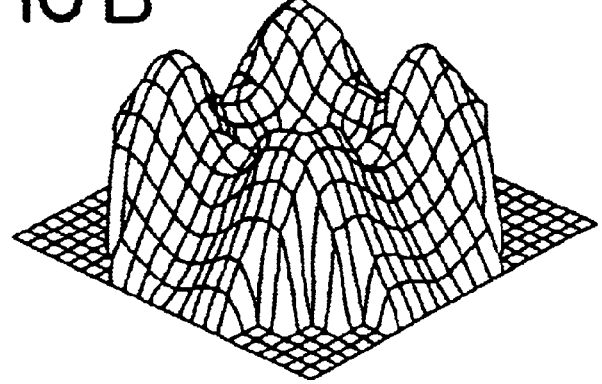
FIG. 10A is a view showing the distribution of the amount of light on a fly's-eye lens by numerical values and FIG. 10B is a view showing three-dimensionally the distribution of the amount of light on the fly's-eye lens.
Figure 11:
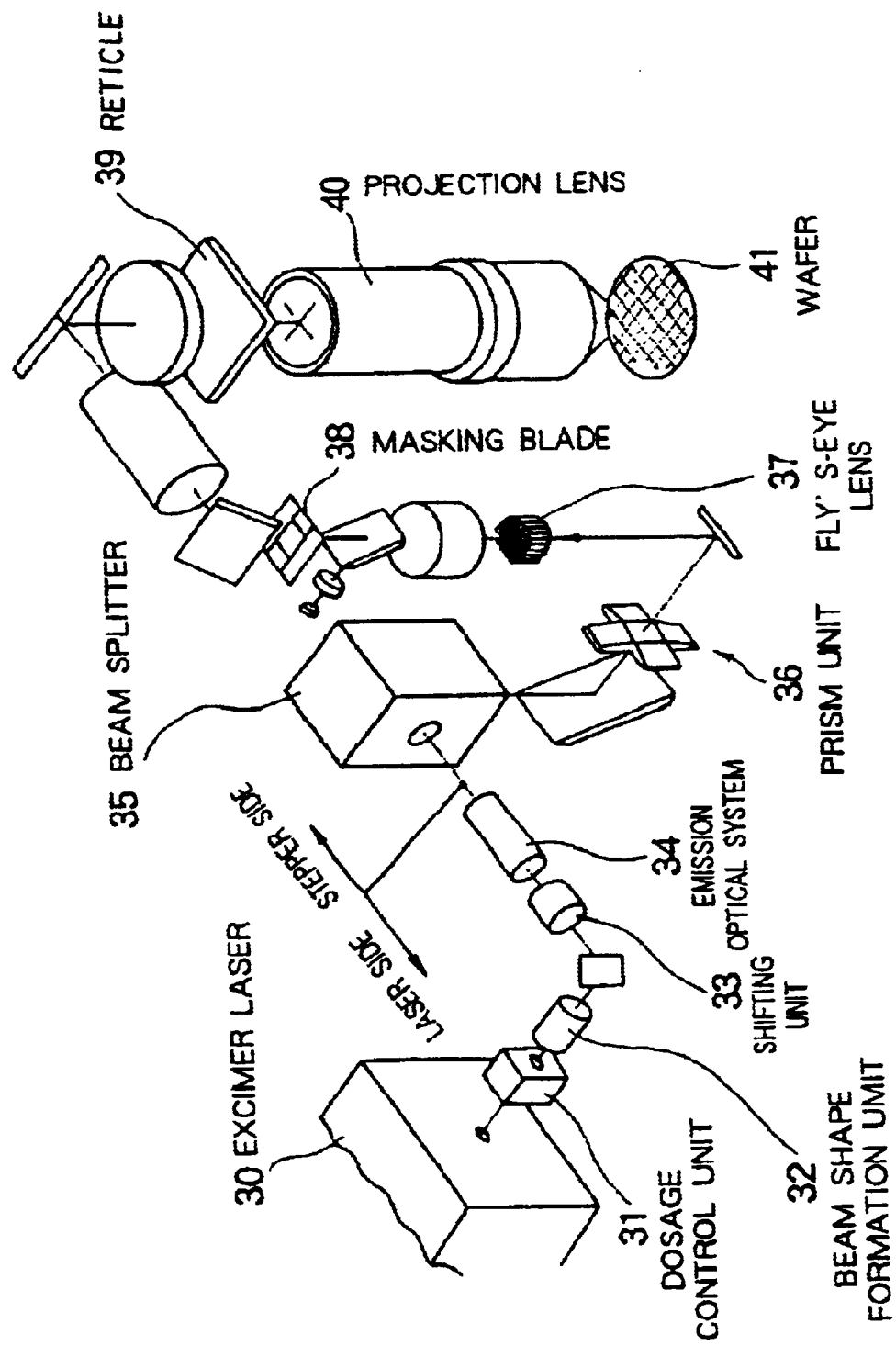
FIG. 11 is a view showing an example of an illumination optical system of a KrF excimer laser stepper.

This example is one wherein the distribution of the amount of light shown in FIGS. 10A and 10B is formed on an incident plane of the fly's-eye lens 37 of an exposure device shown in FIG. 11 and the depth of focus is improved so as to stably transfer a semiconductor device pattern using a halftone phase shifting mask. Note that FIGS. 10A and 10B show a shape wherein a quadrupole is formed, though slight, but there is no problem even if a annular or other shape is adopted. The results shown in the present example are results obtained by using a KrF excimer laser stepper, but the results have generality and are not results which cannot be obtained depending on the wavelength be used. They can be applied as they are to conventionally used g-rays and i-rays as well. Also, they can be preferably used also with respect to future ArF excimer lasers and other wavelengths.

First, an explanation will be made of the overall structure of the exposure device.

As shown in FIG. 11, this exposure device comprises a laser device and a stepper device. The laser device is constituted by an excimer laser 30, a dosage control unit 31, a shifting unit 33, and an emission optical system 34.

The stepper device is constituted by a beam splitter 35, a prism unit 36, a fly's-eye lens 37, a masking blade 38, a reticle 39, and a projection lens 40. The light for exposure emitted from the excimer laser 30 is made incident upon the fly's-eye lens 37 through the aforesaid various optical systems. The fly's-eye lens 37 becomes the secondary light source. That light for exposure reaches the top of the surface of the wafer 41 through the reticle 39 on which the mask pattern is formed. The pattern of the reticle 39 is transferred onto the wafer surface.

The fly's-eye lens 37 is an assembly of a plurality of (for example, 100) lenses. The outer diameter as a whole is usually 5 cm to 20 cm.

Next, an explanation will be made of the procedure when the distribution of the amount of light shown in FIGS. 10A and 10B is selected for the incident plane to the aforesaid fly's-eye lens 37. The procedures of the following (1) to (3) were carried out.

Figure 12A:
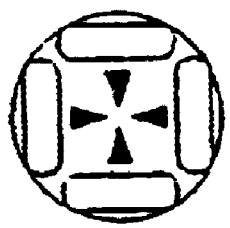
FIG. 12A is a view showing the state of the beam on a prism.
Figure 12B:
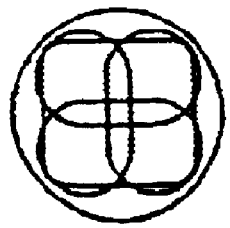
FIG. 12B is a view showing a superposition of beams on the fly's-eye lens.
Figure 12C:
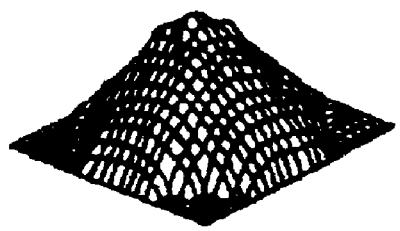
FIG. 12C is a view showing the Gaussian distribution of the amount of light.

(1) The distribution of the amount of light on the surface of the fly's-eye lens of the conventional stepper becomes a Gaussian distribution of a high amount at the center portion and a low amount at the peripheral portions as shown in FIG. 12C. This is because, as shown in FIG. 12A, the light split by the beam splitter 35 is combined by the prism as shown in FIG. 12B.

Since the distribution of the amount of light becomes that shown in FIG. 12C, there was a problem that the illumination light effective for a rough pattern was strong and, simultaneously, the illumination light generating a secondary peak on the wafer 41 surface and effective for a fine pattern was weak.

(2) So as to solve this problem, the intensity of the light of the center portion of the fly's-eye lens was gradually shielded, and the oblique incident component was emphasized to an extent that the secondary peak, which is the problem in a halftone phase shifting mask, was not generated.

(3) As a result, it was found that, when the maximum the intensity of the light existing at the peripheral portions on the fly's-eye lens was defined as 1, in a distribution of intensity wherein the intensity of the center portion was 0.9 or less, preferably 0.8 or less, a secondary peak was not generated.

Figure 13A:
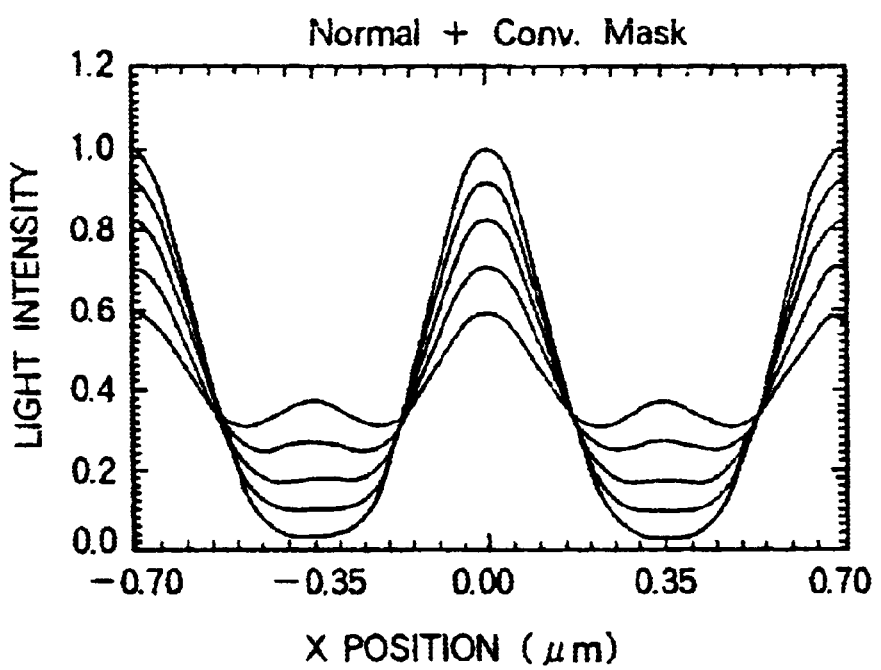
FIG. 13A is a view showing the distribution of the intensity of the light in a high density pattern where a reticle composed of a usual chromium mask is used and in addition the distribution of the amount of light on the fly's-eye lens is a Gaussian distribution and FIG. 13B is a view showing the distribution of the intensity of the light in the high density pattern where a reticle composed of a usual chromium mask is used and in addition the distribution of the amount of light on the fly's-eye lens is the distribution shown in FIGS. 10A and 10B.
Figure 13B:
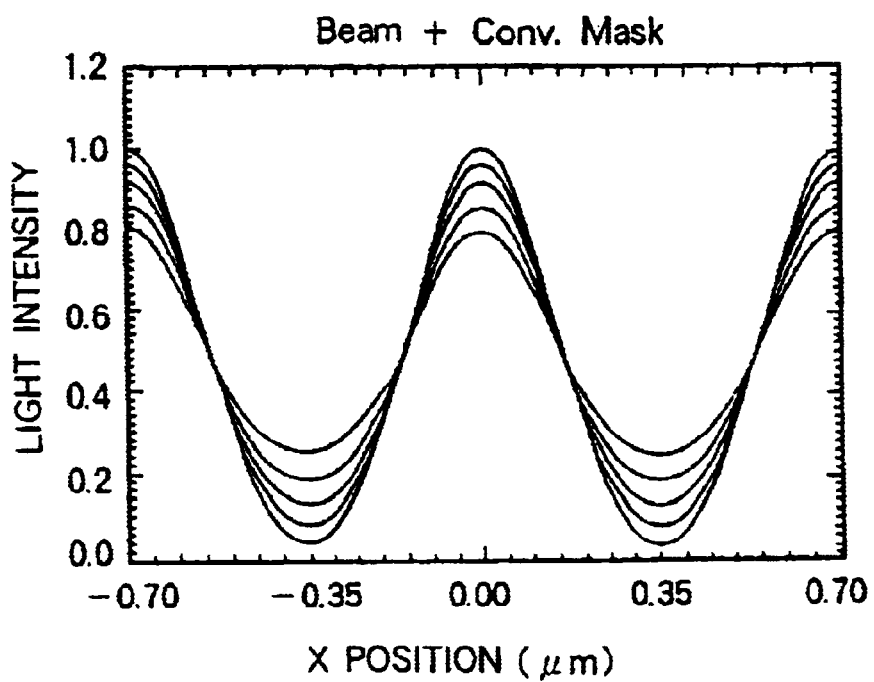

FIG. 13A shows the distribution of the intensity of the light in a high density pattern in a case where a reticle comprising a usual chromium mask was used and in addition the distribution of the amount of light on the fly's-eye lens was a Gaussian distribution. FIG. 13B shows the distribution of the intensity of the light in a high density pattern in a case where the reticle comprising a usual chromium mask is used and in addition the distribution of the amount of light on the fly's-eye lens is the distribution shown in FIGS. 10A and 10B.

Figure 14A:
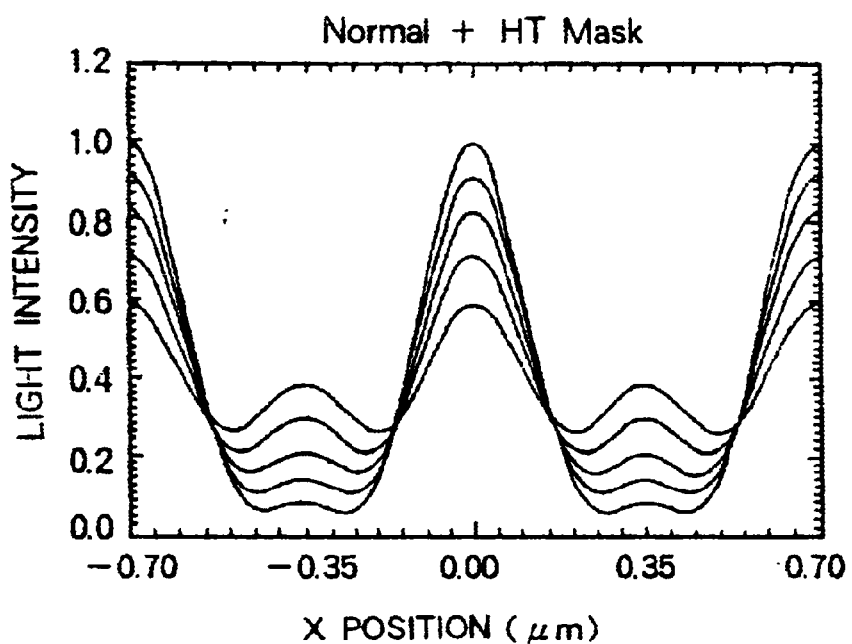
FIG. 14A is a view showing a distribution of the intensity of the light in a high density pattern where a reticle composed of a phase shift halftone mask is used and in addition the distribution of the amount of light on the fly's-eye lens is a Gaussian distribution and FIG. 14B is a view showing the distribution of the intensity of the light in the high density pattern where a reticle composed of a phase shift halftone mask is used and in addition the distribution of the amount of light on the fly's-eye lens is the distribution shown in FIGS. 10A and 10B.
Figure 14B:
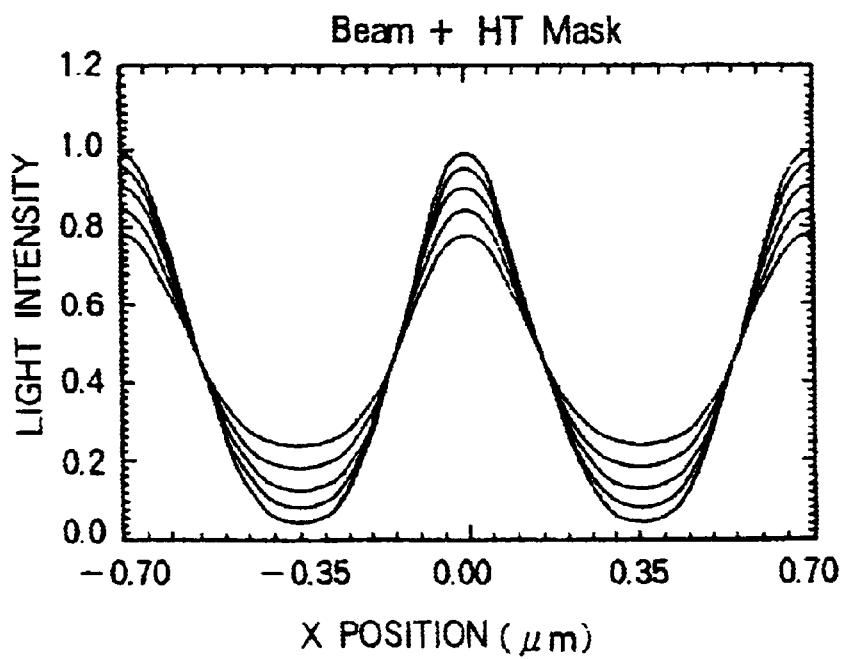

FIG. 14A shows the distribution of the intensity of the light in a high density pattern in a case where a reticle comprising a phase shift halftone mask was used and in addition the distribution of the amount of light on the fly's-eye lens was a Gaussian distribution. FIG. 14B shows the distribution of the intensity of the light in a high density pattern in a case where the reticle comprising a phase shift halftone mask was used and in addition the distribution of the amount of light on the fly's-eye lens was the distribution shown in FIGS. 10A and 10B.

In FIGS. 13A and 13B and 14A and 14B, the conditions were a wavelength λ for the exposure light of 248 nm, a numerical aperture NA of 0.45, a σ of 0.7, a ratio of the line width versus the interval of 1:1, and a resolution of 0.35 μm. The focus F was changed to 0.0, 0.4, 0.6, 0.8, and 1.0 μm.

As shown in FIG. 13B and FIG. 14B, when the method of the present invention is used, the secondary peak is reduced.

The results shown in FIGS. 10A and 10B show the formation of a quadrupole, though slight, but there is no problem even if an annular or other shape is adopted. In the end, it is sufficient so far as the intensity of the center portion is 0.9 or less, preferably 0.8 or less when the maximum intensity of the light existing at the peripheral portions on the fly's-eye lens is defined as 1.

(4) An exposure technique for enlarging the depth of focus, without being influenced by the secondary peak, by using a halftone phase shifting mask and without a placing a load on the design of the mask was established by using the present example.

EXAMPLE 2

The present example is one wherein a desired distribution of the intensity of the light on the fly's-eye lens in the present invention is formed when stably transferring a semiconductor device pattern by using KrF excimer lithography using the halftone phase shifting mask. The procedures of the following (1) to (3) were carried out.

(1) In the illumination optical system of the KrF excimer laser stepper shown in FIG. 11, the laser beam was divided into four beams by the beam splitter. Therefore, a desired distribution of the amount of light was reproduced on the fly's-eye lens by adjusting the opening angle of the beams and beam intervals when resuperposing these divided beams.

Figure 15A:
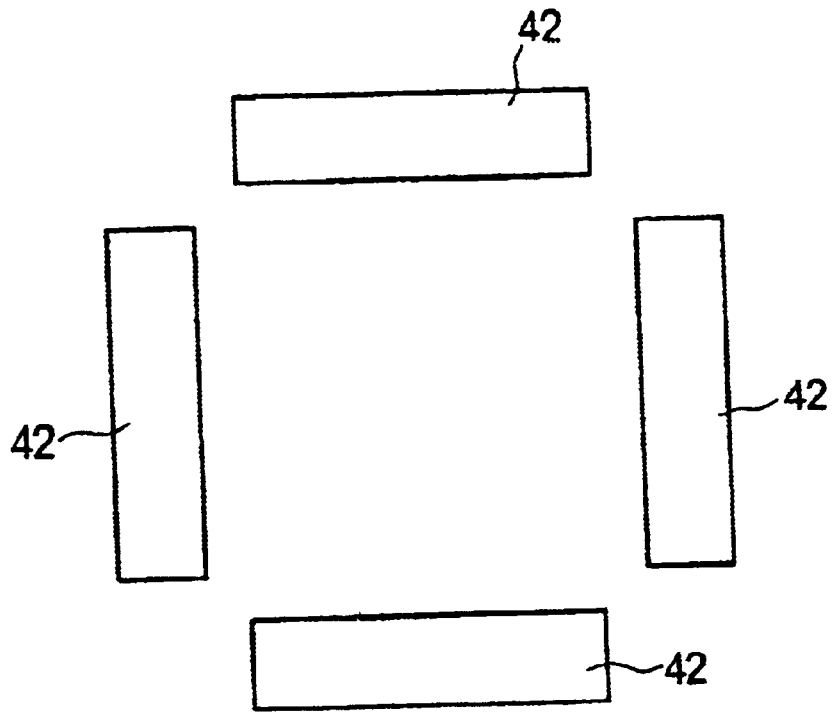

(2) Namely, by dividing a beam 42 as shown in FIG. 15A by the beam splitter 35 shown in FIG. 11 and superposing the resultant beams by using a prism unit 36 shown in FIG. 11 (refer to FIG. 15B), the desired distribution of the amount of light of the present example was reproduced on the fly's-eye lens.

Figure 15B:
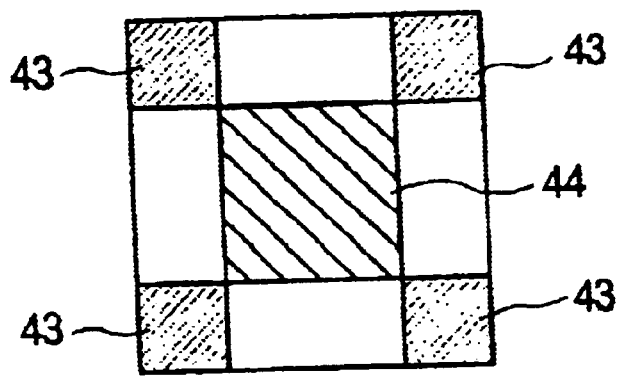

In FIG. 15A, the shape of the light source after the superposition determined how much the respective beams 42 before the superposition were shifted to the inside or how much the dimensions were to be made at the shorter side direction of the beams. In FIG. 15B, the four corner portions 43 are light superposition portions and parts acting as the peak parts of the amount of light. At the center portion 44, light exists due to the spread of the respective beams, but the amount of light is low.

The distribution of the amount of light on the fly's-eye lens surface obtained when the beams are superposed by using the present method is similar to the results shown in FIGS. 10A and 10B.

(3) From the above, in the example of the present invention, a shape of a light source emphasizing the oblique incident component to such an extent that the secondary peak was not generated was established.

EXAMPLE 3

In the above-described Example 2, when forming a shape of the light source shape emphasizing the oblique incident component to such an extent that the secondary peak is not generated, if the intensity of the light at the center portion on the fly's-eye lens is set too small, the problem inherent in the oblique incident exposure method mentioned above becomes more conspicuous, although a secondary peak is not generated. The present example is one wherein the lower limit (2 percent) of the intensity of the light of the center portion on the fly's-eye lens is found based on the following optimization:

(1) The influence exerted upon the resolution performance when changing the intensity of the light at the center portion of the fly's-eye lens is shown in Table 1.

TABLE 1

| | | Comp. Ex. 1 | Ex. A | Ex. B | Ex. C | Ex. D | Comp. Ex 2 | Comp. Ex. 3 |
|---|---|---|---|---|---|---|---|---|
| 0.35 μm DOF (μm) | Center of vertical line | 1.4 | 1.8 | 1.8 | 2.1 | 2.6 | 3.5 | 2.0 |
| | End portion of vertical line | 1.3 | 1.8 | 2.0 | 1.8 | 2.2 | 3.5 | 2.0 |
| | Center of oblique line | 1.6 | 2.0 | 2.1 | 2.1 | 2.4 | 1.8 | 3.3 |

TABLE 1-continued

|  | Comp. Ex. 1 | Ex. A | Ex. B | Ex. C | Ex. D | Comp. Ex 2 | Comp. Ex. 3 |
|---|---|---|---|---|---|---|---|
| End portion of oblique line | 1.5 | 1.6 | 1.5 | 1.7 | 2.2 | 1.7 | 1.8 |
| Vertical isolated line | 1.3 | 1.3 | 1.5 | 1.4 | 1.5 | 1.4 | 1.3 |
| Oblique isolated line | 1.4 | 1.3 | 1.3 | 1.4 | 1.4 | 1.0 | 1.2 |
| Overall | 0.42 | 0.6 | 1.0 | 1.1 | 0.8 | 1.02 | 1.2 |
| CD uniformity ($\mu$m) | 0.062 | 0.065 | 0.060 | 0.050 | 0.070 | 0.062 | 0.042 |
| Illumination output (mw/cm$^2$)llumination | 220 | 220 | 210 | 200 | 194 | 62 | 64 |
| uniformity (%) | 1.4 | 1.5 | 1.3 | 1.5 | 2.0 | 6.6 | 5.7 |
| Light amount of center portion (%) | — | 90% | 50% | 30% | 2% | — | — |
|  | Gauss distribution |  |  |  |  | Four-point illumination | Annular illumination |

Table 1 shows the change of the depth of focus, line width uniformity, illuminance, illuminance unevenness, and distortion with a line width of 0.35 $\mu$m.

In the table, the part indicated by "overall" is the common depth of focus for all these groups. Namely, the values of the depth of focus indicated for "overall" are the depths of focus important when fabricating an actual semiconductor device in which various pattern shapes, roughness or density of pattern, and directivity are contained.

Also, Comparative Example 1 shows a conventional exposure method giving a distribution of the intensity of the light of a Gaussian distribution on the fly's-eye lens surface; Comparative Example 2 shows four-point illumination in the oblique incident illumination; and Comparative Example 3 shows annular illumination.

Examples A, B, C, and D show depths of focus when using distributions of the intensity of the light having a vertical incident component so that the oblique incident component is gradually emphasized in the intensity of the light of the center portion of the fly's-eye lens and the problem possessed by the oblique incident exposure method is not generated. In these Examples A, B, C, and D, the conditions are the same except that the amount of light of the center portion on the incident plane of the fly's-eye lens is changed to 90 percent, 50 percent, 30 percent, and 2 percent, respectively, with respect to the peak value of the peripheral portions.

The overall depth of focus is 0.42 $\mu$m in the conventional exposure method (Comparative Example 1), while the depth of focus is 1.02 $\mu$m in the oblique incident illumination (Comparative Example 2) and 1.2 $\mu$m in the annular illumination (Comparative Example 3). Namely, where the oblique incident illumination and annular illumination are used, there is a conspicuous effect of improvement of the depth of focus at the center portion of a five-bar chart, but the depth of focus containing all patterns due to the already mentioned problem, that is, the adjacency effect, is not so great.

On the other hand, in the intensity of the light at the center portion on the fly's-eye lens, when the oblique incident component is gradually emphasized and a distribution of the intensity of the light having a vertical incident component is used so that the problem possessed by the oblique incident exposure method is not generated (Examples A to D), even in the effect of improvement of the depth of focus at the center line of the five-bar chart, an effect of improvement of the depth of focus equivalent to that by annular illumination (Comparative Example 3) is obtained, i.e., the depth of focus is improved 2.5 times or more compared with the conventional method (Comparative Example 1).

Figure 16:
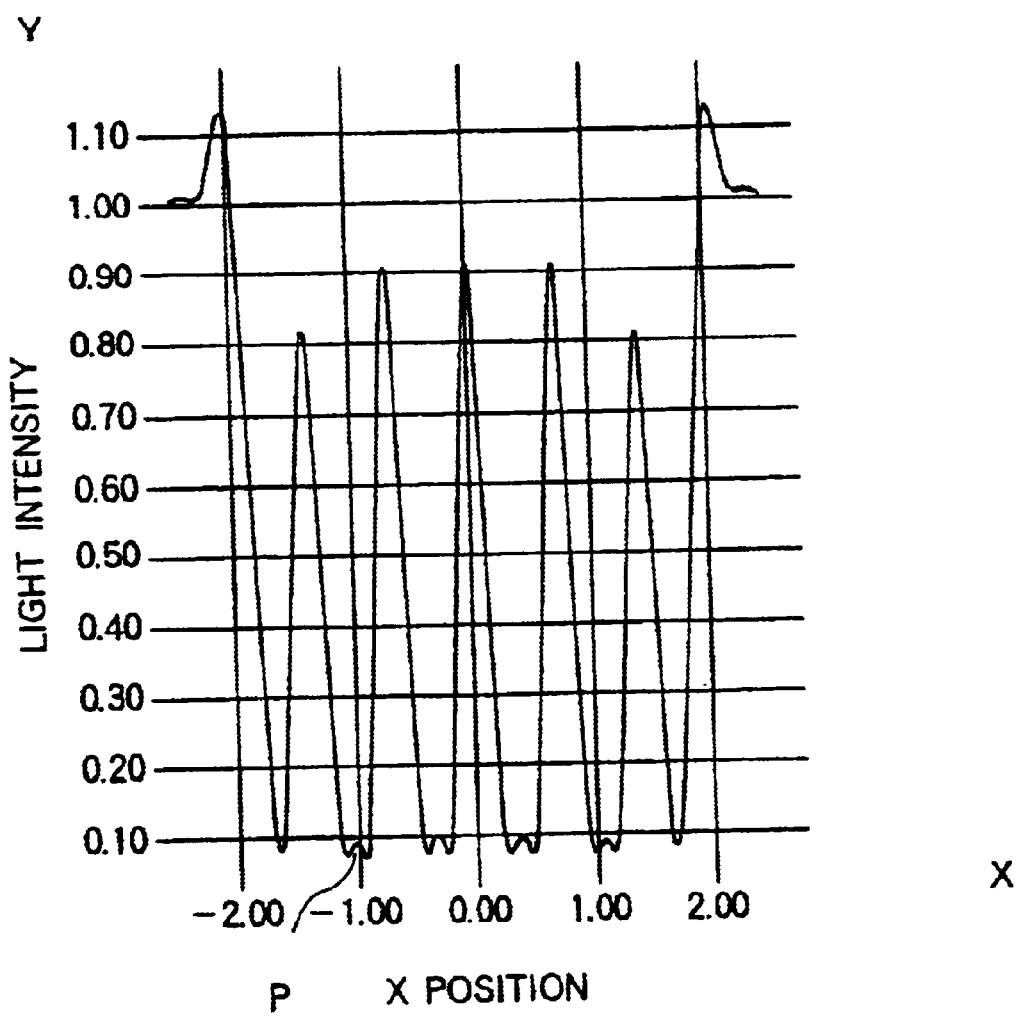
FIG. 16 is graph showing results of measurement of the distribution of the intensity of the light on a wafer surface for Comparative Example 1.
Figure 17:
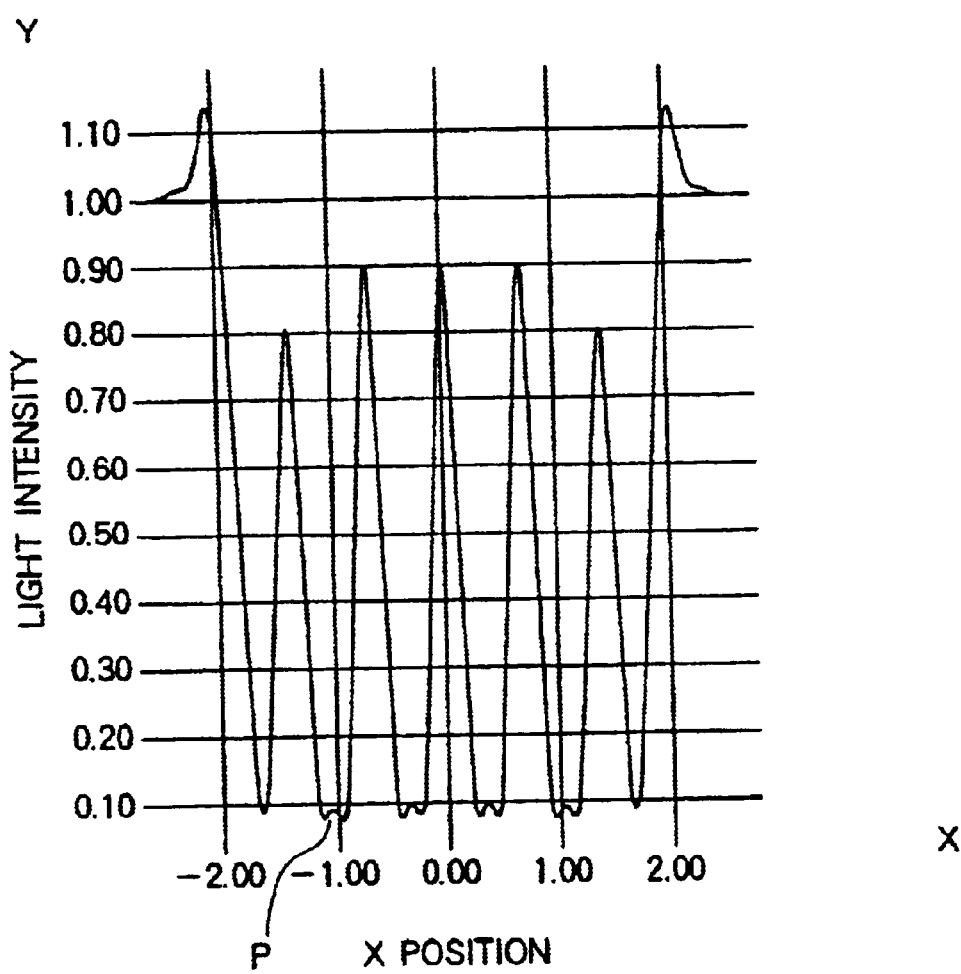
FIG. 17 is a graph showing results of measurement of the distribution of the intensity of the light on the wafer surface for Example A.
Figure 18:
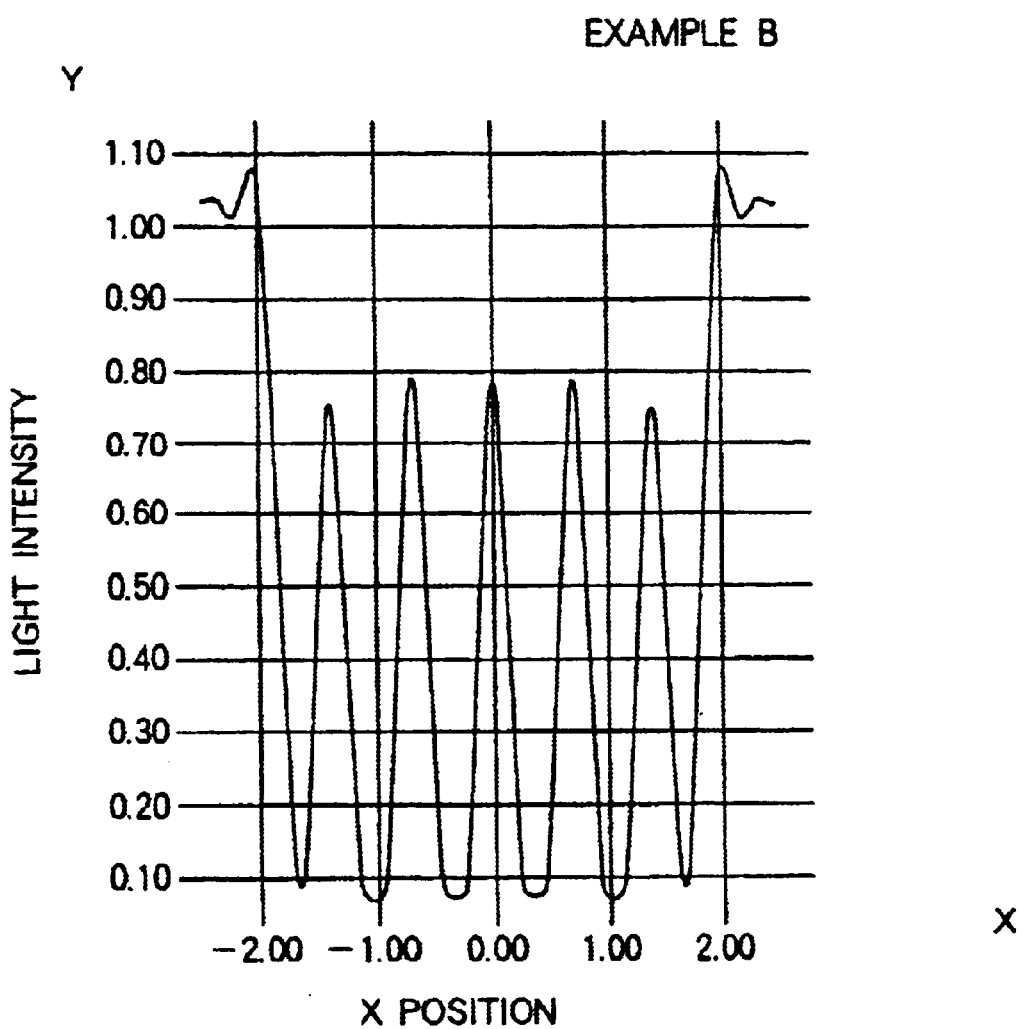
FIG. 18 is a graph showing results of measurement of the distribution of the intensity of the light on the wafer surface for Example B.
Figure 19:
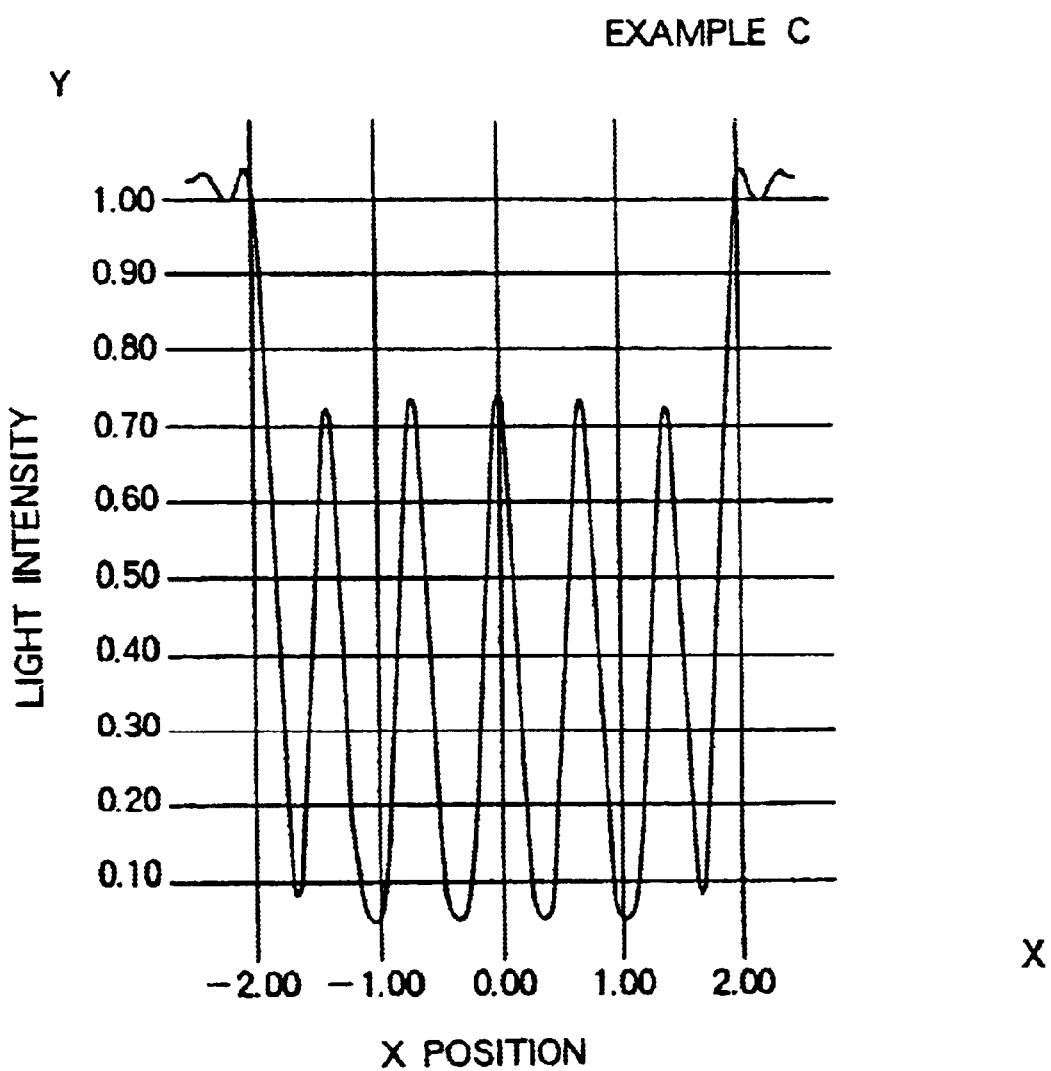
FIG. 19 is a graph showing results of measurement of the distribution of the intensity of the light on the wafer surface for Example C.

The results of measurement of the distribution of the intensity of the light on the wafer surface for the aforesaid Examples A, B, and C are shown in FIGS. 17 to 19, while those for the conventional method (Comparative Example 1) are shown in FIG. 16. As shown in FIGS. 17 to 19, in comparison with the conventional method shown in FIG. 16, in the present Examples A, B, and C, the secondary peak p could be reduced.

Figure 20A:
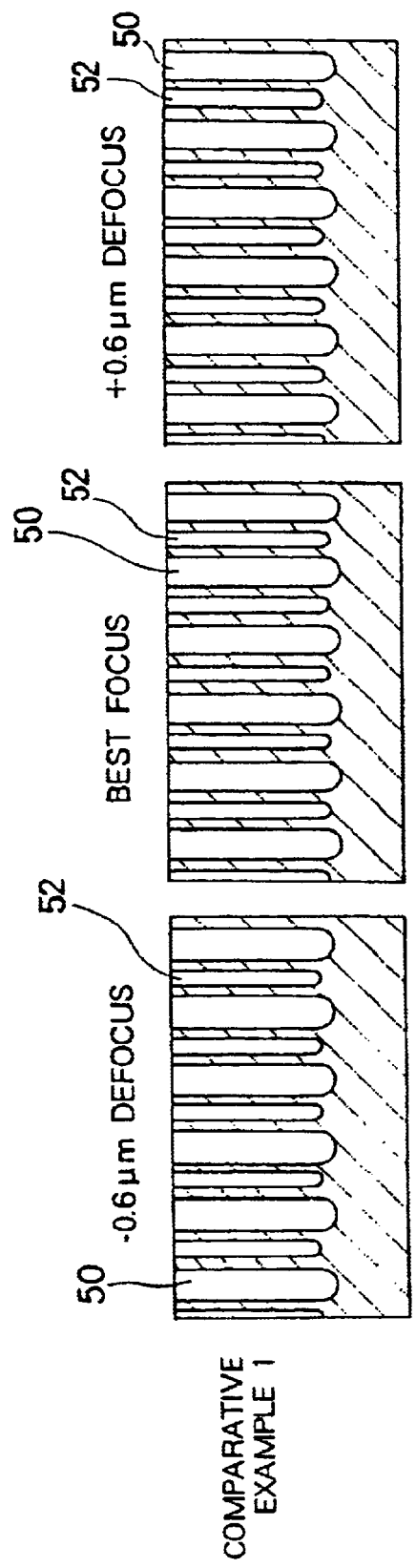
FIG. 20A is a cross-sectional view of a pattern formed where a halftone phase shifting mask is used in a usual illumination state of Comparative Example 1 and FIG. 20B is a cross-sectional view of a pattern formed where the exposure method according to Example C is used.
Figure 20B:
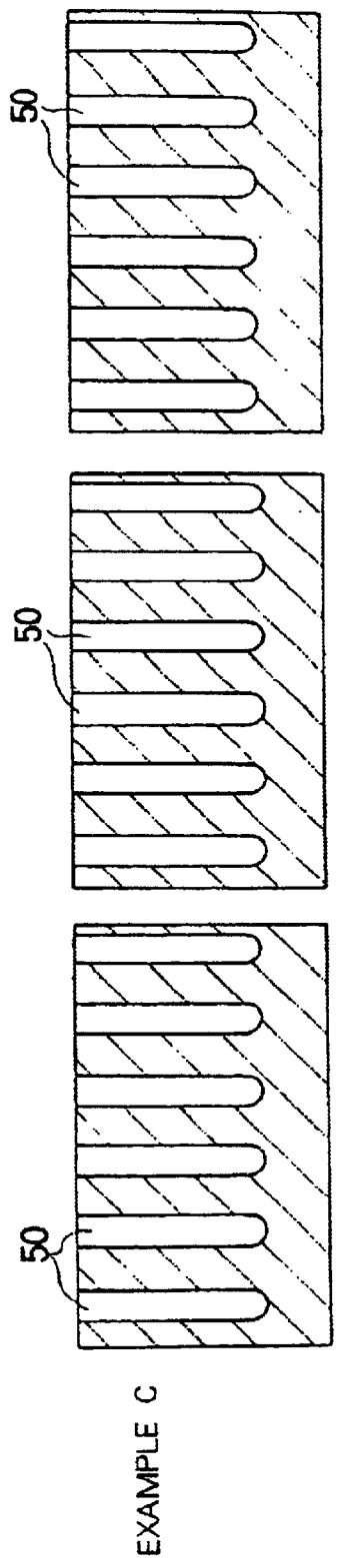

In actuality, in the above-described Comparative Example 1 and Example C, the difference of the resolution performances where the pattern is formed on the surface of the semiconductor wafer is shown in FIGS. 20A and 20B. FIG. 20A is a cross-sectional view of a wafer where a line pattern having a line width of 0.30 $\mu$m is actually formed by using the halftone phase shifting mask in a usual illumination state of Comparative Example 1. The used exposure device is a KrF excimer laser stepper of a numerical aperture of 0.45. As a resist, a chemical amplifying type positive resist was used. Attention was paid to a pattern having a rough/dense ratio of line versus space of 1:1.5.

FIG. 20B is a cross-sectional view of a wafer in the case where light is illuminated onto the fly's-eye lens with a distribution of the amount of light of Example C, this is used as a secondary light source, and a line pattern having a line width of 0.30 $\mu$mn is actually formed by using the halftone phase shifting mask. The other conditions are similar to the case of FIG. 20A.

In the conventional method (Comparative Example 1), the pattern 52 resulting from the secondary peak ends up resolved in addition to the desired pattern portion 50. On the other hand, in the exposure method according to the present Example C, the pattern 50 is preferably formed without influence by the secondary peak. Also, even if the focus is deviated by ±0.6 $\mu$m, a good pattern 50 is formed.

Figure 21A:
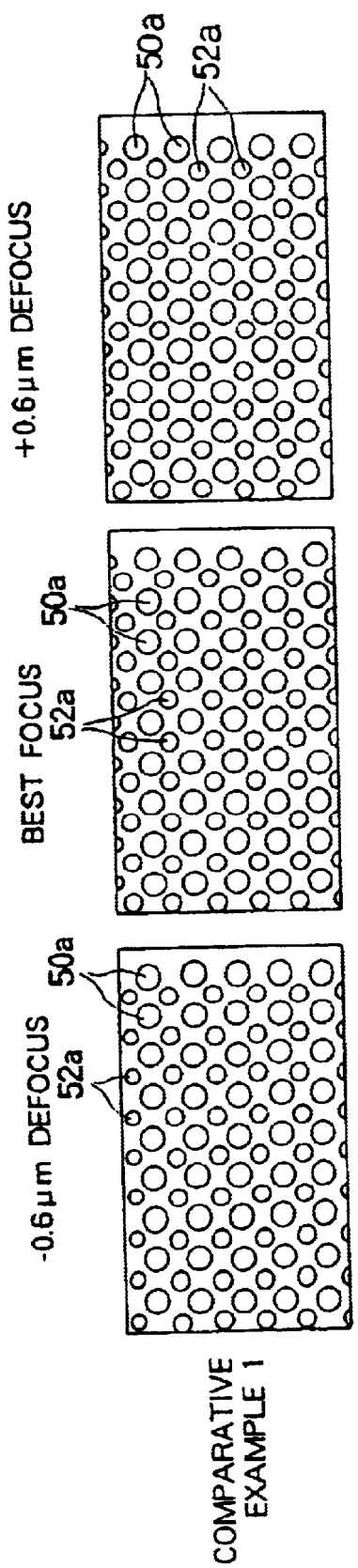
FIG. 21A is a plan view of a contact hole pattern formed where a halftone phase shifting mask is used in a usual illumination state of Comparative Example 1 and FIG. 21B is a cross-sectional view of a contact hole pattern formed where the exposure method according to Example C is used.

FIG. 21A is a plan view of a semiconductor wafer where a contact hole of 0.3 $\mu$m is actually formed by using the halftone phase shifting mask in the usual illumination state of the above-described Comparative Example 1. The used exposure device is a KrF excimer laser stepper of a numerical aperture 0.45. As a resist, a chemical amplifying type positive resist was used. Attention was paid to a pattern having a rough/dense ratio of 1:1.

Figure 21B:
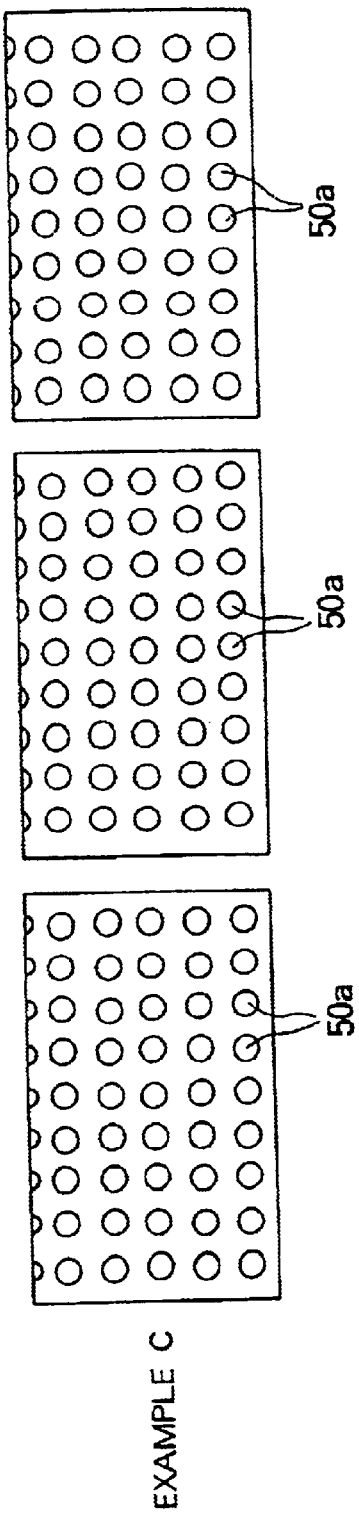

FIG. 21B is a cross-sectional view of a wafer in the case where light is illuminated onto the fly's-eye lens with a distribution of the amount of light of Example C, this is used as a secondary light source, and a contact hole of 0.30 $\mu$m is actually formed by using a halftone phase shifting mask. The other conditions are similar to the case of FIG. 20A.

In the conventional method (Comparative Example 1), the pattern 52a resulting from the secondary peak ends up resolved in addition to the desired pattern portion 50a. On the other hand, in the exposure method according to the present Example C, the pattern 50a is preferably formed without influence by the secondary peak. Also, even if the focus is deviated by ±0.6 $\mu$m, a good pattern 50a is formed.

Figure 22A:
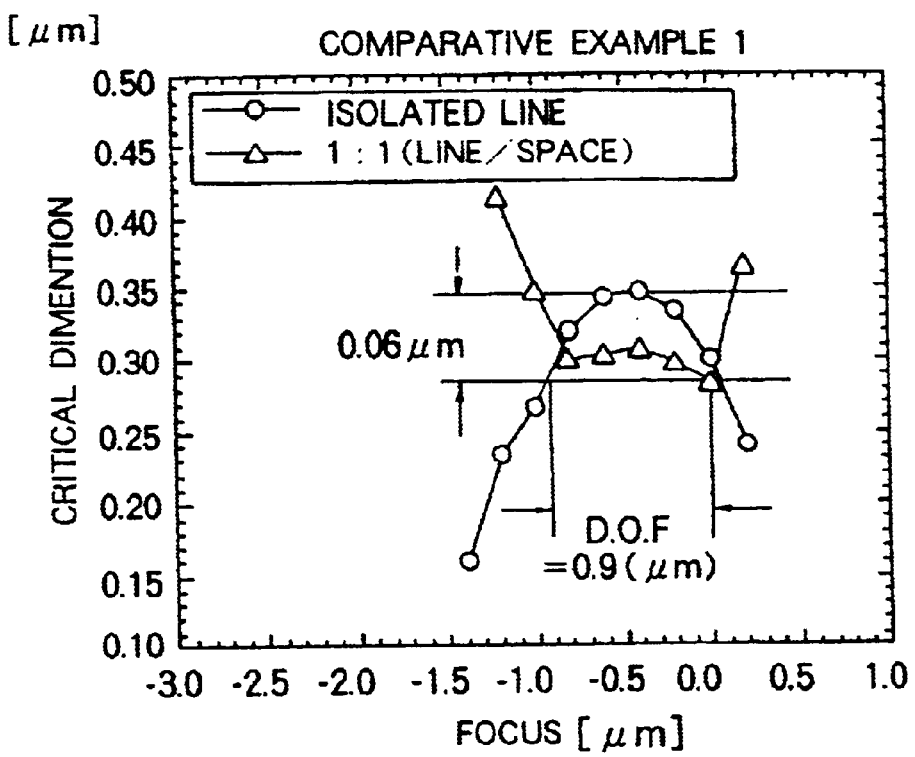
Figure 22B:
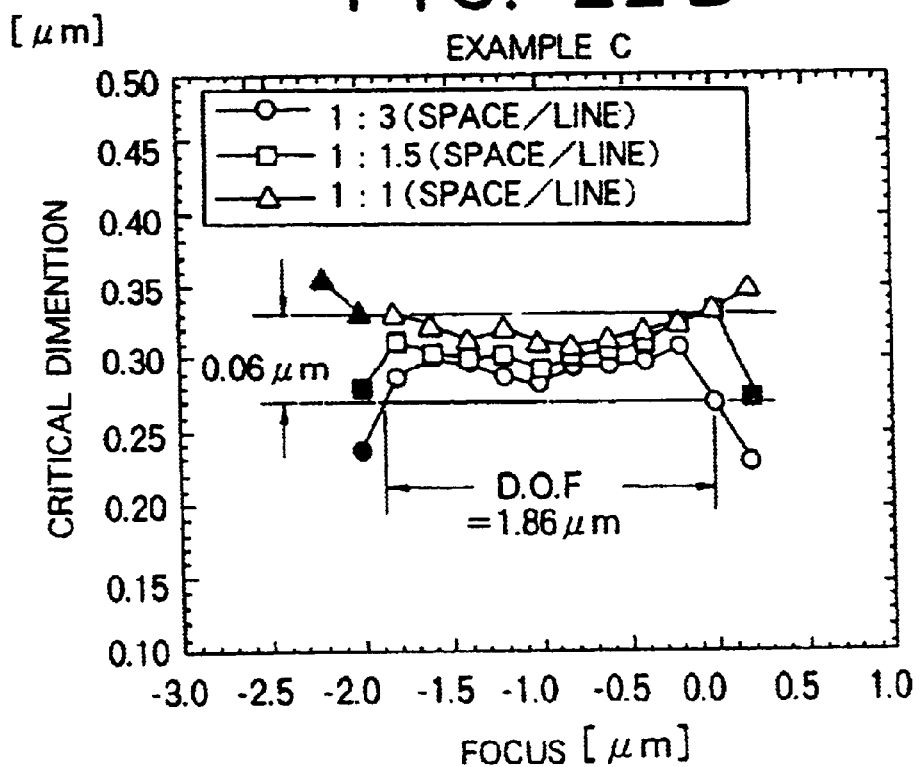

FIGS. 22A and 22B show the effect of improvement of the depth of focus with a line width of 0.30 µ. The used exposure device is a KrF excimer laser stepper of a numerical aperture of 0.45. As the resist, a chemical amplifying type positive resist was used. Attention was paid to patterns having a rough/dense ratio of line versus space of 1:1 and 3:1. When a halftone phase shifting mask was not used and the conventional (Comparative Example 1) distribution of the intensity of the light on the fly's-eye lens was used, a depth of focus of only about 0.9 µm could be obtained. On the other hand, in the exposure method according to the present example C, a depth of focus of 1.86 µm, which is more than two times this, is obtained. Note that, although it has been already mentioned, when the distribution of the intensity of the light on the conventional fly's-eye lens and the halftone phase shifting mask are combined, a pattern resulting from the secondary peak ends up resolved, and allowable imaging is not achieved.

According to the present example C, it was confirmed that the depth of focus could be enlarged without influence by the secondary peak and without a load being placed on the design of the mask by using a halftone phase shifting mask.

(2) As shown in Table 1, the illuminance (illumination output) is lowered to about 30 percent in comparison with the conventional method (Comparative Example 1) when using the oblique incident illumination (Comparative Example 2) method or annular illumination (Comparative Example 3) method. On the other hand, in the present Examples A to D, an illuminance (illumination output) lowered to about 10 percent is enough. Moreover, the unevenness of illumination (illumination uniformity) deteriorates to about 5 percent if the oblique incident method (Comparative Example 2) or the annular illumination method (Comparative Example 3) is used. Considering the sensitivity of the resist, the line width varies due to the unevenness of illumination. On the other hand, when the examples of the present invention are used, the unevenness of illumination is the same degree as with the conventional method, so there is no adverse influence by the present invention.

(3) When defining the intensity at the peripheral portions of the fly's-eye lens as 100, it was found that with a distribution of intensity giving an intensity of the center portion of 2 percent, preferably 20 percent or more, there were none of the problems possessed by the oblique incident exposure method, that is, the increase of the adjacency effect due to the reduction of the effective light source, lowering of the illuminance, increase of the illuminance unevenness, lowering of the exposure margin, a strong influence of the telecentricity, and the like.

Namely, it has been determined that a distribution of the intensity of the light on the fly's-eye lens having a vertical incident component of 2 percent, preferably about 20 percent or more, is preferable so as not to cause the problems possessed by the oblique incident exposure method.

(4) It was found from the above that, according to Example 1 and the present example, when the maximum intensity of the light in the distribution of the intensity of the light on the fly's-eye lens was 100, by setting the intensity of the light of the center portion to 2 to 90 percent, preferably 20 to 80 percent, no secondary peak was generated in the distribution of the intensity of the light on the wafer surface and there were none of the problems inherent in the oblique incident exposure method.

The results shown in the present example are results obtained by using a KrF excimer laser stepper, but the results have generality and can be applied as they are to conventionally used g-rays and i-rays as well. Also, they can be preferably used also with respect to future ArF excimer lasers and other wavelengths.

EXAMPLE 4

The present example is one wherein the desired distribution of the intensity of the light on a fly's-eye lens in the present invention is formed by using an absorption type or reflection type filter mounted on the fly's-eye lens when stably transferring the semiconductor device pattern by using a halftone phase shifting mask.

Figure 23:
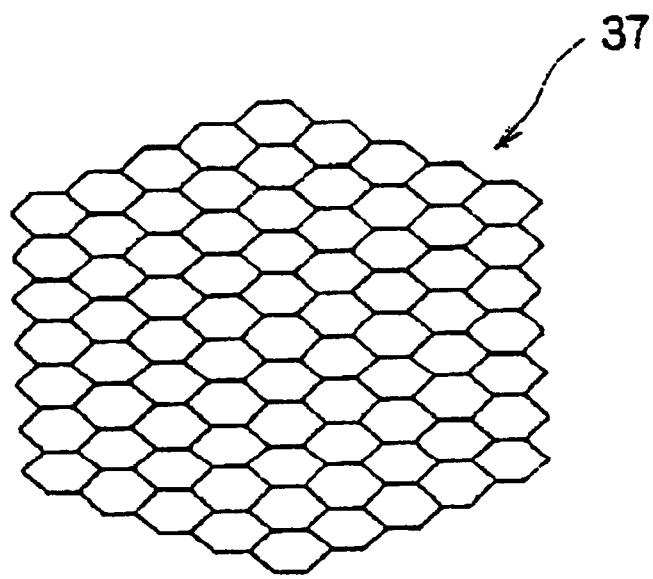
FIG. 23 is a plan view of the fly's-eye lens.

In the illumination optical system of the stepper, when defining the distribution of the intensity of the light immediately before the light is incident upon the fly's-eye lens 37 shown in FIG. 23 as $I_0$ (x, y), the desired distribution of the intensity of the light can be obtained by attaching an absorption or reflection type filter having a transmittance T (x, y) to the position immediately before or after the light is incident on the fly's-eye lens. Namely, a filter having a different transmittance for each position was obtained by vapor-depositing a semi-transparent film to the surface of a ground material such as of synthetic quartz. Note, the coordinate system on the fly's-eye lens surface is made (x, y)

Due to the above, a state of the light source which emphasizes an oblique incident component to such an extent that a secondary peak is not generated and does not have any of the problems inherent in the oblique incident exposure method was established.

EXAMPLE 5

Figure 24:
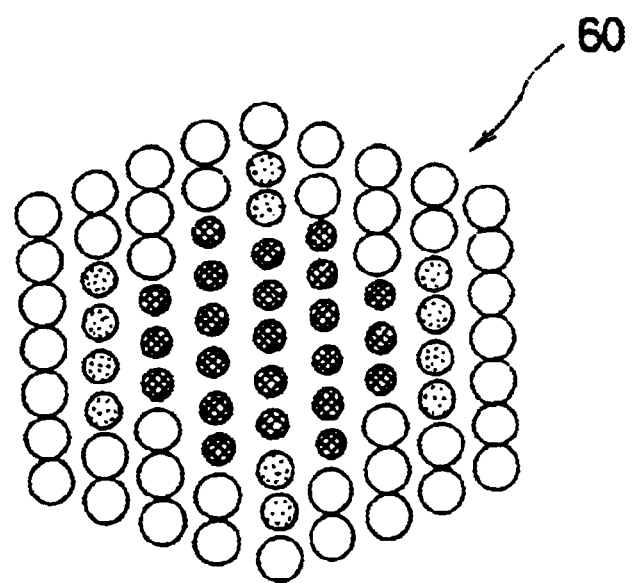
FIG. 24 is a view showing the concept of a mechanical filter.

The present example is one wherein the desired distribution of the amount of light is formed on the fly's-eye lens surface by using a mechanical filter 60 as shown in FIG. 24 when stably transferring a semiconductor device pattern by using a halftone phase shifting mask.

In the distribution of the intensity of the light immediately before the light is incident upon the fly's-eye lens, in the case of a so-called "Gaussian distribution" illumination where the center portion has a strong intensity of the light, a metal plate provided with openings having a size the same extent as that of the individual fly's-eye lenses for the peripheral region in which the oblique incident component should be emphasized and having gradual smaller openings than that of the individual fly's-eye lenses toward the center region is inserted immediately before the fly's-eye lens so that the distribution of the intensity of the light immediately after the transmission through the fly's-eye lens becomes the desired distribution of the intensity of the light.

Note that, in the case of a so-called "flat" illumination where the distribution of the intensity of the light immediately before the light is incident upon the fly's-eye lens is flat, a metal plate provided with openings having a size the same extent to that of the individual fly's-eye lenses for the region in which the oblique incident component should be emphasized having smaller openings than that of individual fly's-eye lenses at the center portion where the intensity of the light should be lowered is inserted immediately before the fly's-eye lens so that the distribution of the intensity of the light immediately after the transmission through the fly's-eye lens becomes the desired distribution of the intensity of the light.

Due to the above, a state of the light source which emphasizes an oblique incident component to such an extent that a secondary peak is not generated and does not have any of the problems inherent in the oblique incident exposure method was established.

EXAMPLE 6

Figure 25:
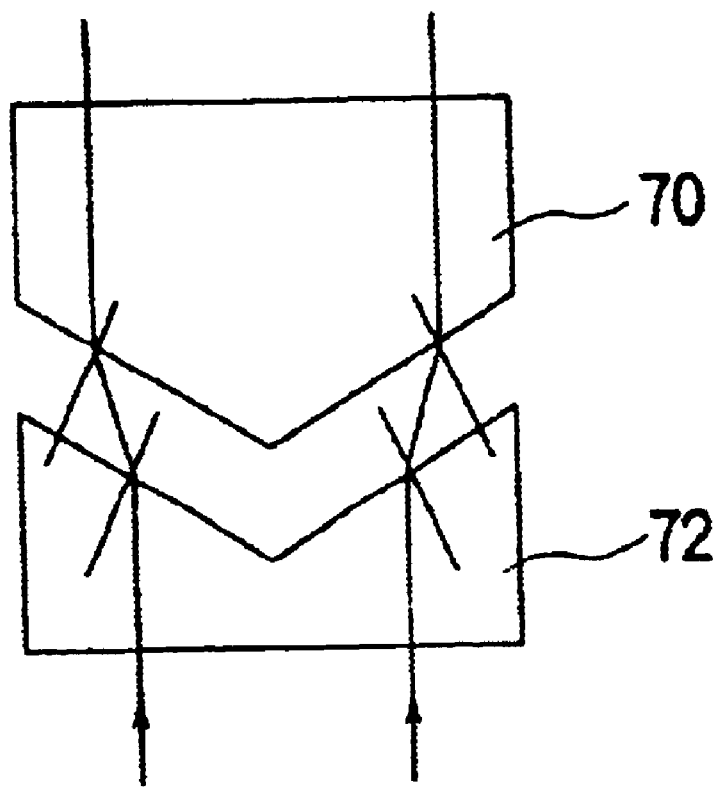
FIG. 25 is a view showing the state of a beam when a pyramid prism or conical prism is used.

The present example is one wherein the desired distribution of the intensity of the light on the fly's-eye lens in the present invention is obtained by attaching a pyramid prism or a conical prism in the interior of the illumination system, which has not been divided in the light path, when stably transferring a semiconductor device pattern by using a halftone phase shifting mask. It is also possible use these prisms alone or to use a prism 70 integral with a optical part 72 having a shape fitting the same as shown in FIG. 25. Where used integrally, when the exposure method according to the present invention is used, the desired distribution of the intensity of the light on the fly's-eye lens is obtained by making the distance between the prism 70 and the optical part 72 having a shape fitting the same variable.

Moreover, in the formation of a pattern by using usual illumination as well, use may be made of a prism and an optical part 72 having a shape fitting the same attached closely together. Namely, a zoom function is given by either of the prism 70 or the optical part 72 having a shape fitting the same and the zoom function is controlled by input from the console side.

Due to the above, a state of the light source which emphasizes an oblique incident component to such an extent that a secondary peak is not generated and does not have any of the problems inherent in the oblique incident exposure method was established.

EXAMPLE 7

The present example is one wherein, when stably transferring a semiconductor device pattern by using a halftone phase shifting mask, the light path is divided into two or more paths, the illumination light is irradiated onto the fly's-eye lens by using a vibration mirror having a concave surface or a rotating polygonal mirror in individual light paths, and use is made of the difference of the scanning speed at the surfaces of points of the fly's-eye lens depending upon the shape of the mirror surface so as to control the oblique incident component and vertical incident component through the entire exposure time and control the distribution of the deffracted light at the mask. Note, the scanning directions when using the two or more divided beams are made orthogonal. Note that the scanning speed was controlled by synchronizing the same with the resist exposure time.

Due to the above, a state of the light source which emphasizes an oblique incident component to such an extent that a secondary peak is not generated and does not have any of the problems inherent in the oblique incident exposure method was established.

EXAMPLE 8

This example is one in which the intensity of the light at the center portion of the fly's-eye lens is made 30 percent relative to that of the peripheral portions as in Example C of the above Example 3 when transferring a memory cell pattern using a halftone phase shifting mask. The distribution of the intensity of the light is the same as the distribution shown in FIGS. 10A and 10B. The exposure device used was the one shown in FIG. 11. More specifically, use was made of a KrF excimer laser stepper of a numerical aperture of 0.45. Further, as the resist, use was made of a chemically amplified positive resist (WKR-PT2).

Figure 26:
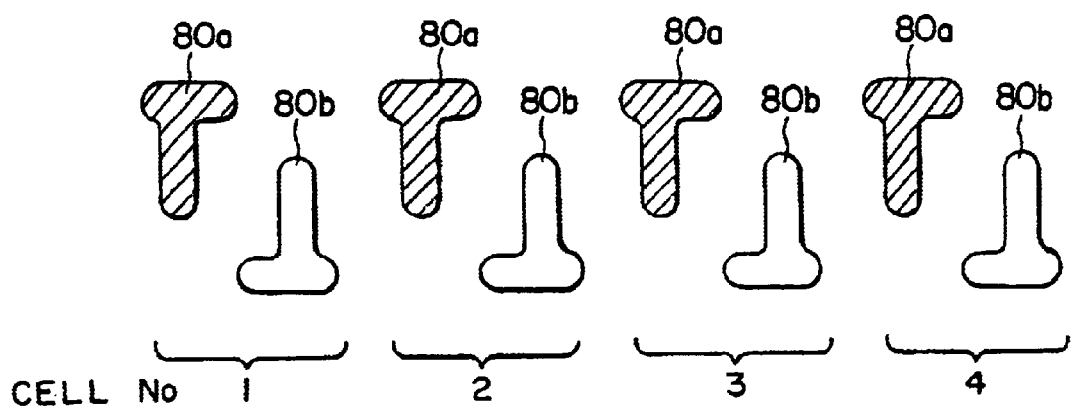
FIG. 26 is a schematic view of a pattern for explaining Example 8.
Figure 27A:
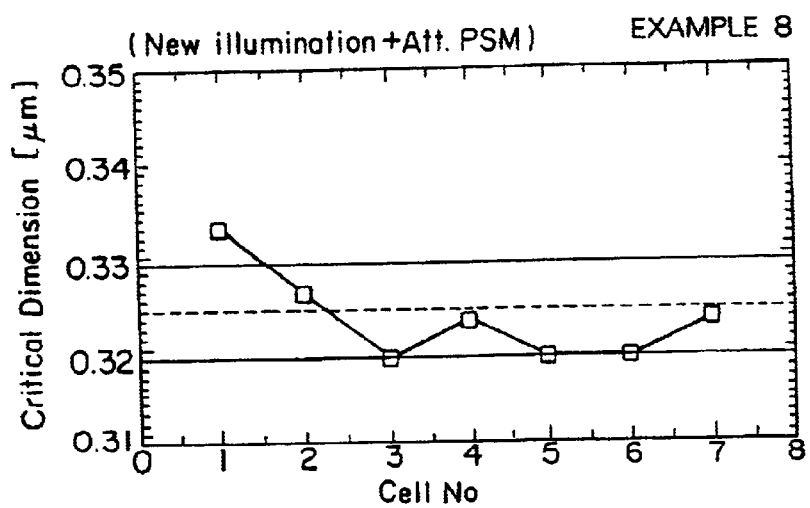
FIGS. 27A to 27C are graphs showing the variations in critical dimensions.

An outline of the memory cell pattern obtained by this exposure is shown in FIG. 26. One cell is constituted by a pair of gate electrodes 80a and 80b. Considering the fact that the memory cells are densely arranged no matter what the position on the wafer, cell numbers were given in order from the end and the critical dimensions of the pattern of one electrode in a cell, for example, the left side gate electrode 80a, were measured. The variations in the critical dimensions in Example 8 are shown in FIG. 27A.

Figure 27B:
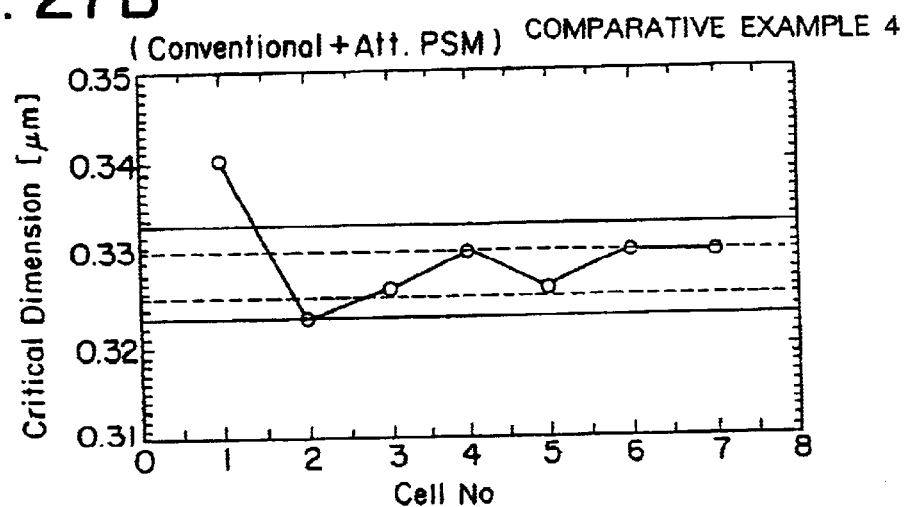

As Comparative Example 4, the same procedure was performed as in Example 8, except that the distribution of the intensity of light irradiated on the fly's-eye lens was made the Gaussian distribution shown in FIG. 12C, to form a memory cell pattern. The results of measurement, performed in the same way as in Example 8, are shown in FIG. 27B.

Figure 27C:
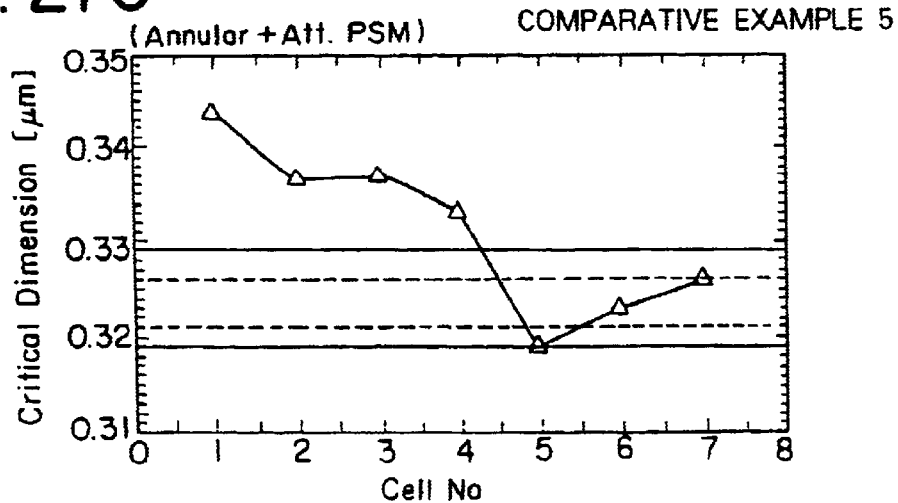

As Comparative Example 5, the same procedure was performed as in Example 8, except that the distribution of the intensity of light irradiated on the fly's-eye lens was made an annular illumination distribution (the intensity of the light at the center portion of 0), to form a memory cell pattern. The results of measurement, performed in the same way as in Example 8, are shown in FIG. 27C.

In Example 8, it was confirmed that the variations in critical dimensions were greatly reduced compared with Comparative Example 5 of the annular illumination. Further, in Comparative Example 4, while there was little variation in the critical dimensions, the effective light source was a conventional Gaussian distribution one, so there was the chance of occurrence of a secondary peak and the depth of focus was small.

EXAMPLE 9

This example is one in which the intensity of the light at the center portion of the fly's-eye lens is made 30 percent relative to that of the peripheral portions as in Example C of the above Example 3 when transferring a 0.30 μm inside diameter contact hole pattern using a halftone phase shifting mask. The distribution of the intensity of the light is the same as the distribution shown in FIGS. 10A and 10B. The exposure device used was the one shown in FIG. 11. More specifically, use was made of a KrF excimer laser stepper of a numerical aperture of 0.45. Further, as the resist, use was made of a chemically amplified positive resist (WKR-PT2).

Patterns were formed under conditions of a best focus, a −1.0 μm defocus, and a +1.0 μm defocus for patterns of ratios of the inside diameter of the contact holes and the intervals between them (duty ratio) of 1:3, 1:1.5, and 1:1. That is, patterns were formed for nine sets of conditions. SEM photographs of the contact hole patterns obtained under these nine sets of exposure conditions are shown all together in FIG. 28A. As illustrated, it was confirmed that contact hole patterns can be excellently formed even if the duty ratios differ or with defocusing.

As Comparative Example 6, the same procedure was performed as in Example 9, except that the distribution of the intensity of light irradiated on the fly's-eye lens was made the Gaussian distribution shown in FIG. 12C, to form contact hole patterns. The results of observation by SEM photographs, performed in the same way as in Example 9, are shown in FIG. 28B. In patterns with densely arranged holes, holes caused by the secondary peak ended up being formed.

As Comparative Example 7, the same procedure was performed as in Example 9, except that the distribution of the intensity of light irradiated on the fly's-eye lens was made an annular illumination distribution (the intensity of the light at the center portion of 0), to form contact hole patterns. The results of observation by SEM photographs, performed in the same way as in Example 9, are shown in FIG. 28B. While there was no problem at the time of the best focus, good holes could not be formed at the time of defocusing.

EXAMPLE 10

Example 10 is one in which the amount of the light emitted from the center portion of the effective light source is lowered by a certain amount relative to the amount of light emitted from the peripheral portions of the effective light source by passing light through a first filter with a higher transmittance at the peripheral portions as against the center portion for a time of 0.05×T to 0.95×T, when a single exposure time is T, and not passing it through the filter in the remaining exposure time.

In this example, use is made of an exposure device of the basic configuration shown in FIG. 11. In the state where the light is not passed through the filter, the distribution of the intensity of the light incident on the fly's-eye lens used as the effective light source is made the flat distribution of intensity of light shown in FIG. 29.

Figure 32A:
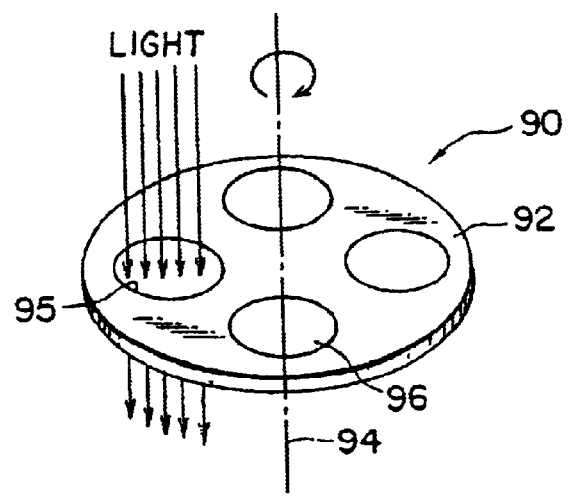
FIGS. 32A to 32C are views of examples of switching devices of filters.

In this example, the rotary disk type filter switching device 90 shown in FIG. 32A, for example, is disposed at the light incident side or the light emission side of the fly's-eye lens 37 shown in FIG. 11. This filter switching device 90 is comprised of the rotary disk 92 and a rotary drive shaft 94 for driving the same. The rotary disk 92 has formed on it, along the peripheral direction, a light transmitting opening 95, a filter 96, and other filters. The filter 96, for example as shown in FIG. 30A, blocks light in a range of 0.5 from the center portion when the outer diameter is 1.0.

When a single total exposure time is 1 second, in the initial 0.2 second, the exposure light is passed through the opening 95 shown in FIG. 32A, then the rotary disk 92 is rotated instantaneously and the exposure light is passed through the filter 96 for exposure in the remaining 0.8 second. As a result, as shown in FIG. 31, the distribution of the intensity of the light from the effective light source per single exposure time becomes equal to the distribution of the intensity of light of the sum of the product of the distribution of the intensity of light shown in FIG. 29 and time and the product of the distribution of the intensity of light shown in FIG. 30A and time.

Accordingly, in this example as well, the distribution of the intensity of light of the light source can give a certain degree of intensity of light at the center portion of the light source while emphasizing the two-beam component and enables enlargement of the depth of focus of the dense pattern without affecting isolated patterns.

In this example, a halftone mask was used as the mask, but a usual chromium mask can also be used. Further, the total exposure time is not limited to one second. It may be made shorter or longer depending on the other conditions.

EXAMPLE 11

Example 11 is one in which the amount of the light emitted from the center portion of the effective light source is lowered by a certain amount relative to the amount of light emitted from the peripheral portions of the effective light source by passing the light through a first filter with a higher transmittance at the peripheral portions as against the center portion for a time of 0.05×T to 0.95×T, when a single exposure time is T, and not passing it through the filter in the remaining exposure time.

In this example, use is made of an exposure device of the basic configuration shown in FIG. 11. In the state where the light is not passed through the filter, the distribution of the intensity of the light incident on the fly's-eye lens used as the effective light source is made the flat distribution of intensity of light shown in FIG. 29.

Figure 32B:
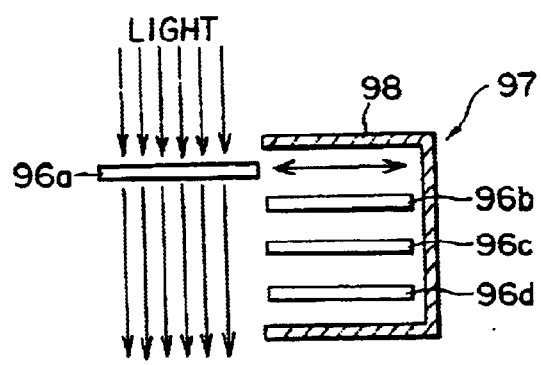

In this example, the sliding type filter switching device 97 shown in FIG. 32B, for example, is disposed at the light incident side or the light emission side of the fly's-eye lens 37 shown in FIG. 11. This filter switching device 97 is provided with a filter holder 98 which holds a plurality of types of filters 96a to 96d and can slide them at a high speed. The filter 96a, for example as shown in FIG. 30A, blocks light in a range in a cross-like range of a width of 0.35 when the outer diameter is 1.0.

Figure 33:
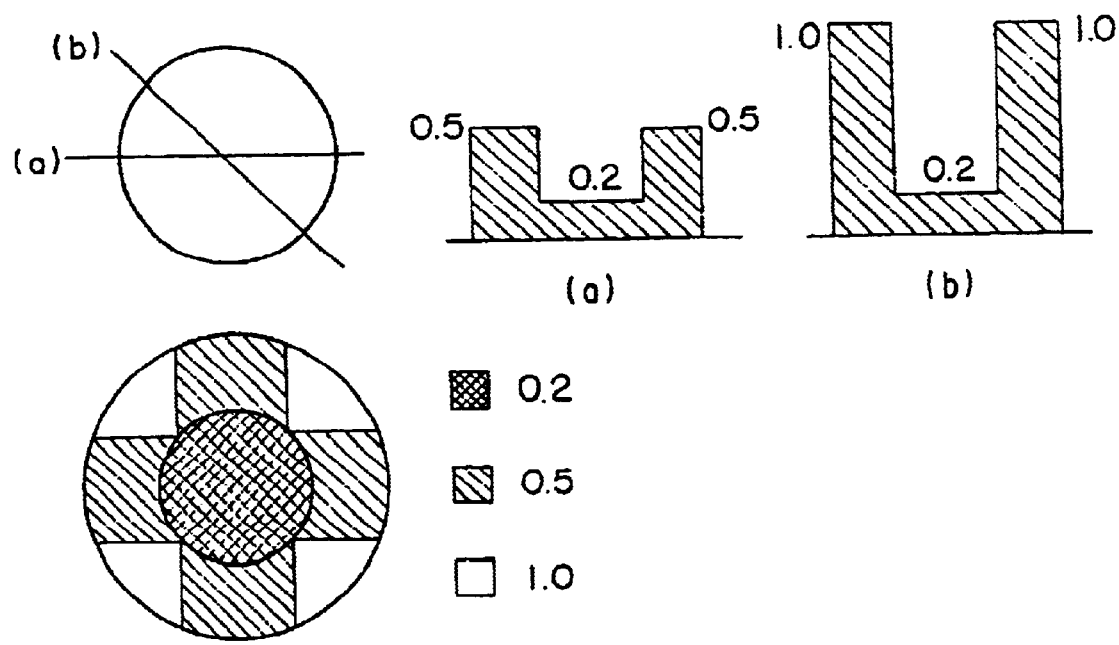
FIG. 33 is a view showing the concept of addition of distributions of the intensity of the light.

When a single total exposure time is 1 second, in the initial 0.2 second, all of the filters 96a to 96d are retracted in the holder 98 shown in FIG. 32B and exposure light is not passed through any filter. Next, the filter 96a is slid out instantaneously and the exposure light is passed through the filter 96a for exposure for 0.3 second. Next, the filter 96a shown in FIG. 32B is slid back into the holder 98 instantaneously and, simultaneously, the filter 96b is slide out and the exposure light is passed through the filter 96b for exposure in the remaining 0.5 second. As a result, as shown in FIG. 33, the distribution of the intensity of the light from the effective light source per single exposure time becomes equal to the distribution of the intensity of light of the sum of the product of the distribution of the intensity of light shown in FIG. 29 and time and the product of the distribution of the intensity of light shown in FIG. 30A and time.

Accordingly, in this example as well, the distribution of the intensity of light of the light source can give a certain degree of intensity of light at the center portion of the light source while emphasizing the two-beam component and enables enlargement of the depth of focus of the dense pattern without affecting isolated patterns.

In this example, a halftone mask was used as the mask, but a usual chromium mask can also be used. Further, the total exposure time is not limited to one second. It may be made shorter or longer depending on the other conditions.

EXAMPLE 12

Example 12 is one in which the amount of the light emitted from the center portion of the effective light source is lowered by a certain amount relative to the amount of light emitted from the peripheral portions of the effective light source by passing light through a filter with a variable transmittance and performing exposure while changing the distribution of the light transmittance of the filter midway in a single exposure time.

In this example, use is made of an exposure device of the basic configuration shown in FIG. 11. In the state where the light is not passed through the filter, the distribution of the intensity of the light incident on the fly's-eye lens used as the effective light source is made the flat distribution of intensity of light shown in FIG. 29.

Figure 32C:
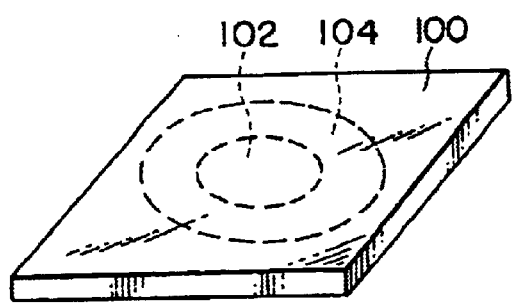

In this example, the optical shutter type optical material 100 shown in FIG. 32C, for example, is disposed at the light incident side or the light emission side of the fly's-eye lens 37 shown in FIG. 11. This optical shutter type optical material is for example comprised of PLZT (lead zirconate titanium dioxide with lanthanum) and is provided with a plurality of fine electrodes on at least one side of its substrate. The light transmittance of this material changes upon application of voltage. By suitably designing the shapes of the electrodes provided on the surface of the optical material 100, it is possible to separately control the central region 102 and the peripheral region 104 and possible to instantaneously block light at just the center portion 102 by applying voltage.

When a single total exposure time is 1 second, in the initial 0.2 second, the center portion 102 and the peripheral portion 104 shown in FIG. 32C are made to transmit light and the exposure light is passed through them. Next, voltage is instantaneously applied to just the electrodes of the center portion 102 to make the center portion 102 block light. The exposure light is passed in this state. As a result, it is possible to obtain similar results as with Example 10.

Note that it is possible to obtain various types of distributions of intensity of light by suitably designing the shapes of the electrodes formed on the surface of the optical material 100, the intervals of their arrangement, and the conditions of application of voltage.

Accordingly, in this example as well, the distribution of the intensity of light of the light source can give a certain degree of intensity of light at the center portion of the light source while emphasizing the two-beam component and enables enlargement of the depth of focus of the dense pattern without affecting isolated patterns.

In this example, a halftone mask was used as the mask, but a usual chromium mask can also be used. Further, the total exposure time is not limited to one second. It may be made shorter or longer depending on the other conditions.

EXAMPLE 13

Figure 34:
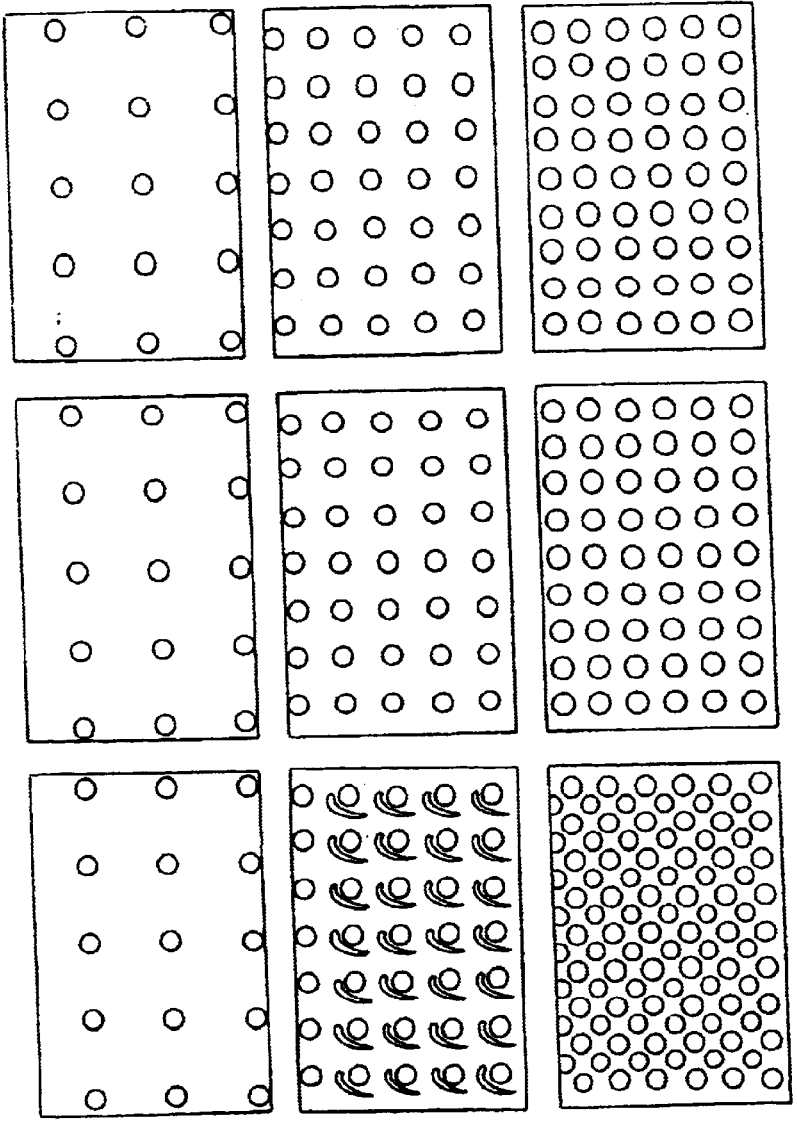
FIGS. 34A to 34C are SEM photographs of hole patterns of the examples and comparative examples.

This example is one in which use is made of any of the multiple exposures shown in Examples 10 to 12 to obtain the effective light source of the distribution of the intensity of light shown in FIG. 34B.

Using an effective light source with a low intensity of light at the center portion, a halftone phase shifting mask, and a KrF excimer laser stepper of a numerical aperture of 0.45, contact hole patterns of inside diameters of 0.30 μm were formed on substrates. As the resist, use was made of a chemically amplified positive resist (WKR-PT2). The contact hole patterns were formed changing the ratio between the inside diameter of the contact holes and the intervals between them (duty ratio) to 1:3, 1:1.5, and 1:1. The results of SEM photographs are shown in FIG. 34B.

As Comparative Example 8, the same procedure was performed as in Example 13, except that the distribution of the intensity of light irradiated on the fly's-eye lens was made the Gaussian distribution shown in FIG. 34C, to form contact hole patterns under three sets of conditions. The results of observation by SEM photographs, performed in the same way as in Example 13, are shown in FIG. 34B. In patterns with densely arranged holes, holes caused by the secondary peak ended up being formed.

Further, as Comparative Example 9, the same procedure was followed as in Example 13, except that the distribution of the intensity of the light irradiated on the fly's-eye lens was made a distribution of an annular illumination (the intensity of the light at the center portion of 0), to form a contact hole pattern under three sets of conditions. The results of examination by SEM photographs in the same way as in Example 9 are shown in FIG. 34C.

Figure 35:
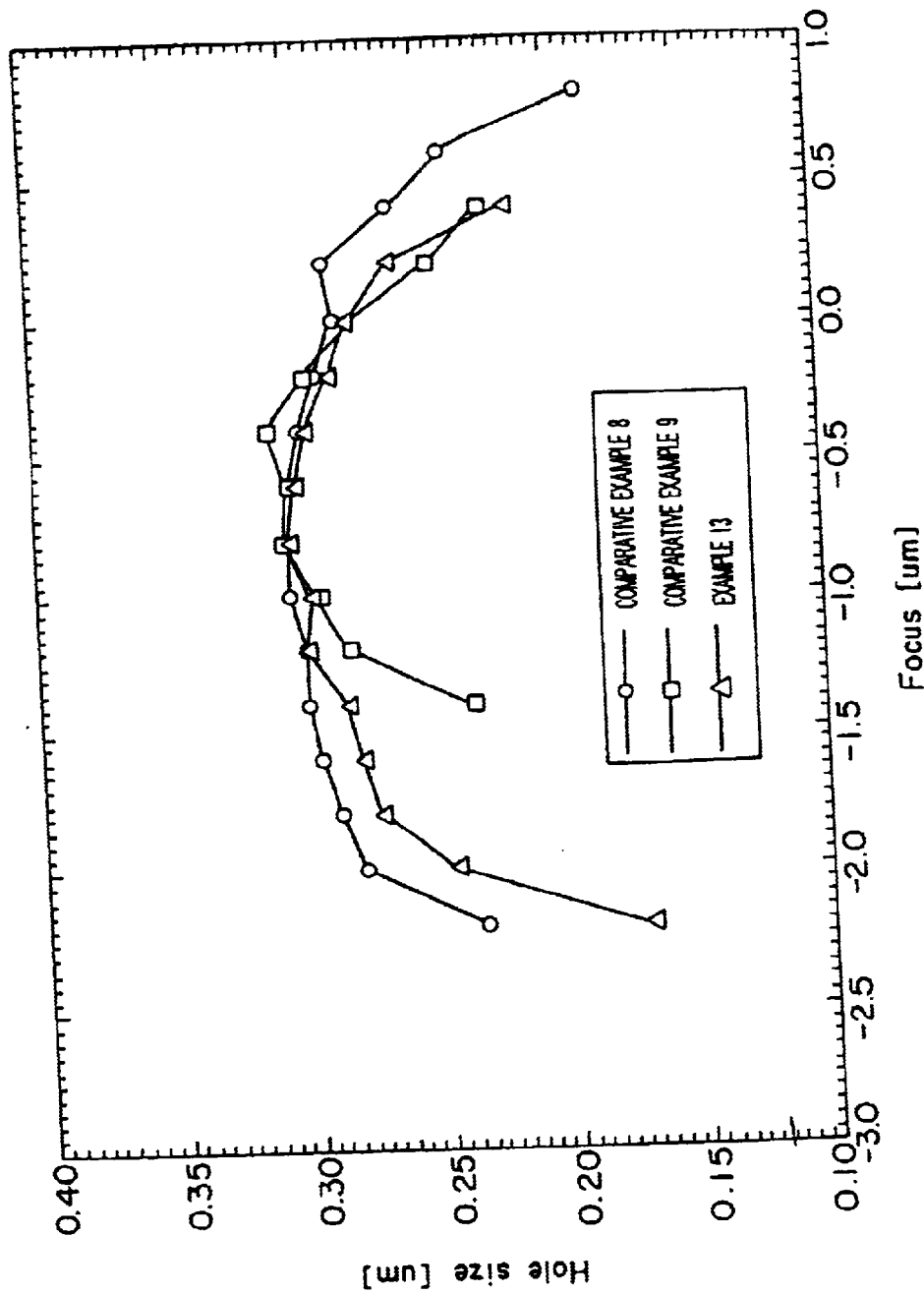
FIG. 35 is a view of the depth of focus in the examples and comparative examples.

Further, the results of measurement of the depth of focus of the isolate pattern in Example 13 and Comparative Examples 8 and 9 are shown in FIG. 35. In Example 13, it was confirmed, a depth of focus equal to the normal illumination of Comparative Example 13 was secured.

According to the present invention, at the time of a fabrication of a semiconductor device, even if the mask pattern is fine, a device pattern can be formed well with a necessary sufficient depth of focus.

What is claimed is:

1. A method of pattern formation comprising:
    irradiating light from an effective light source to a phase shifting mask, wherein said effective light source has a center portion, said center portion being 10 to 40% of an outer diameter of said effective light source, and
    with said irradiated light, transferring a pattern of the mask onto a substrate,
    wherein an amount of light emitted from said center portion of said effective light source is less than a peak amount of light emitted from peripheral portions of the effective light source by 2 to 90 percent;
    said method further comprising filtering light from said effective light source through an optical filter having a center portion corresponding to said center portion of said effective light source, said center portion of said filter having a first light transmittance and peripheral portions of said filter having a second light transmittance which is greater than said first light transmittance.

2. The method of pattern formation as set forth in claim 1; wherein an exposure time equals T, and said method further comprises, passing light from said effective light source through said filter for a time equal to 5% to 95% of T.

3. An apparatus for forming a pattern on a substrate, comprising:
    a phase shifting mask having a pattern; and
    an effective light source for irradiating light to said mask to transfer said pattern of said mask onto a substrate, wherein said effective light source has a center portion, said center portion being 10 to 40% of an outer diameter of said effective light source;
    wherein an amount of light emitted from said center portion of said effective light source is less than a peak amount of light emitted from peripheral portions of said effective light source by 2 to 90 percent;
    wherein said effective light source comprises a fly's eye lens; and
    wherein said fly's eye lens comprises a plurality of individual lenses, with individual lenses in said center portion of said effective light source having first diameters which are smaller than second diameters of individual lenses in said peripheral portions of said effective light source.

4. The apparatus as set forth in claim 3, wherein said second diameters are 1.1 to 3 times larger than said first diameters.

5. An apparatus for forming a pattern on a substrate, comprising:
    a phase shifting mask having a pattern; and
    an effective light source for irradiating light to said mask to transfer said pattern of said mask onto a substrate, wherein said effective light source has a center portion, said center portion being 10 to 40% of an outer diameter of said effective light source;
    wherein an amount of light emitted from said center portion of said effective light source is less than a peak amount of light emitted from peripheral portions of said effective light source by 2 to 90 percent;

wherein said effective light source comprises an optical filter having a center portion, corresponding to said center portion of said effective light source, with a first light transmittance and peripheral portions with a second light transmittance which is greater than said first light transmittance.

6. A method of pattern formation comprising:

irradiating light from an effective light source to a mask, wherein said effective light source has a center portion, said center portion being 10 to 40% of an outer diameter of said effective light source, with said irradiated light, transferring a pattern of the mask onto a substrate, wherein an amount of light emitted from said center portion of said effective light source is less than a peak amount of light emitted from peripheral portions of the effective light source by 2 to 90 percent; and filtering light from said effective light source through an optical filter having a center portion corresponding to said center portion of said effective light source, said center portion of said filter having a first light transmittance and peripheral portions of said filter having a second light transmittance which is greater than said first light transmittance.

7. The method of pattern formation as set forth in claim 6, wherein an exposure time equals T, and said method further comprises, passing light from said effective light source through said filter for a time equal to 5% to 95% of T.

* * * * *